(12) United States Patent
Tsuda et al.

(10) Patent No.: US 9,880,436 B2
(45) Date of Patent: Jan. 30, 2018

(54) LIQUID CRYSTAL DISPLAY DEVICE AND MANUFACTURING METHOD THEREOF

(71) Applicant: Mitsubishi Electric Corporation, Tokyo (JP)

(72) Inventors: Yuki Tsuda, Kumamoto (JP); Takuji Imamura, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/356,891

(22) Filed: Nov. 21, 2016

(65) Prior Publication Data
US 2017/0176826 A1    Jun. 22, 2017

(30) Foreign Application Priority Data

Dec. 22, 2015  (JP) .................................. 2015-249295

(51) Int. Cl.
*H01L 21/44*    (2006.01)
*G02F 1/1362*    (2006.01)
(Continued)

(52) U.S. Cl.
CPC ...... *G02F 1/136213* (2013.01); *G02F 1/1368* (2013.01); *G02F 1/13439* (2013.01); *G02F 1/136227* (2013.01); *G02F 1/136286* (2013.01); *H01L 21/44* (2013.01); *G02F 2001/136218* (2013.01); *G02F 2001/136295* (2013.01); *G02F 2202/10* (2013.01); *G02F 2203/01* (2013.01); *H01L 29/41733* (2013.01); *H01L 29/45* (2013.01); *H01L 29/7869* (2013.01)

(58) Field of Classification Search
CPC .......... H01L 29/7869; H01L 29/41733; H01L 21/44; H01L 29/45; G02F 1/136213; G02F 1/136227
See application file for complete search history.

(56) References Cited

U.S. PATENT DOCUMENTS 8,253,873 B2    8/2012 Sasaki et al.
8,368,830 B2    2/2013 Sasaki et al.
(Continued)

FOREIGN PATENT DOCUMENTS

JP    01-129234 A    5/1989
JP    02-081029 A    3/1990
(Continued)

*Primary Examiner* — Dung Le
(74) *Attorney, Agent, or Firm* — Studebaker & Brackett PC

(57) ABSTRACT

A liquid crystal display device includes a gate electrode, a first insulating film, an element layer, a first transparent electrode, and a second transparent electrode. The first insulating film includes a part that covers the gate electrode. The element layer is directly disposed on the first insulating film, includes a channel region that faces the gate electrode across the first insulating film, and is made of a transparent oxide. The first transparent electrode is directly disposed on the first insulating film while being separated from the element layer, and has the same metal composition as the metal composition of the element layer. The second transparent electrode forms a storage capacitance with the first transparent electrode by facing the first transparent electrode while being electrically insulated from the first transparent electrode.

9 Claims, 18 Drawing Sheets

(51) Int. Cl.
  *G02F 1/1343* (2006.01)
  *G02F 1/1368* (2006.01)
  *H01L 29/417* (2006.01)
  *H01L 29/45* (2006.01)
  *H01L 29/786* (2006.01)

(56) References Cited

U.S. PATENT DOCUMENTS

| | | |
|---|---|---|
| 8,879,036 B2 | 11/2014 | Sasaki et al. |
| 9,261,747 B2 | 2/2016 | Sasaki et al. |
| 2013/0228772 A1 | 9/2013 | Choi et al. |
| 2015/0017761 A1* | 1/2015 | Ando ............... H01L 21/428 438/104 |
| 2015/0053969 A1* | 2/2015 | Ito .................. H01L 27/1225 257/43 |
| 2016/0116812 A1 | 4/2016 | Sasaki et al. |

FOREIGN PATENT DOCUMENTS

| | | |
|---|---|---|
| JP | 08-179363 A | 7/1996 |
| JP | 2009-058913 A | 3/2009 |

\* cited by examiner

F I G. 1
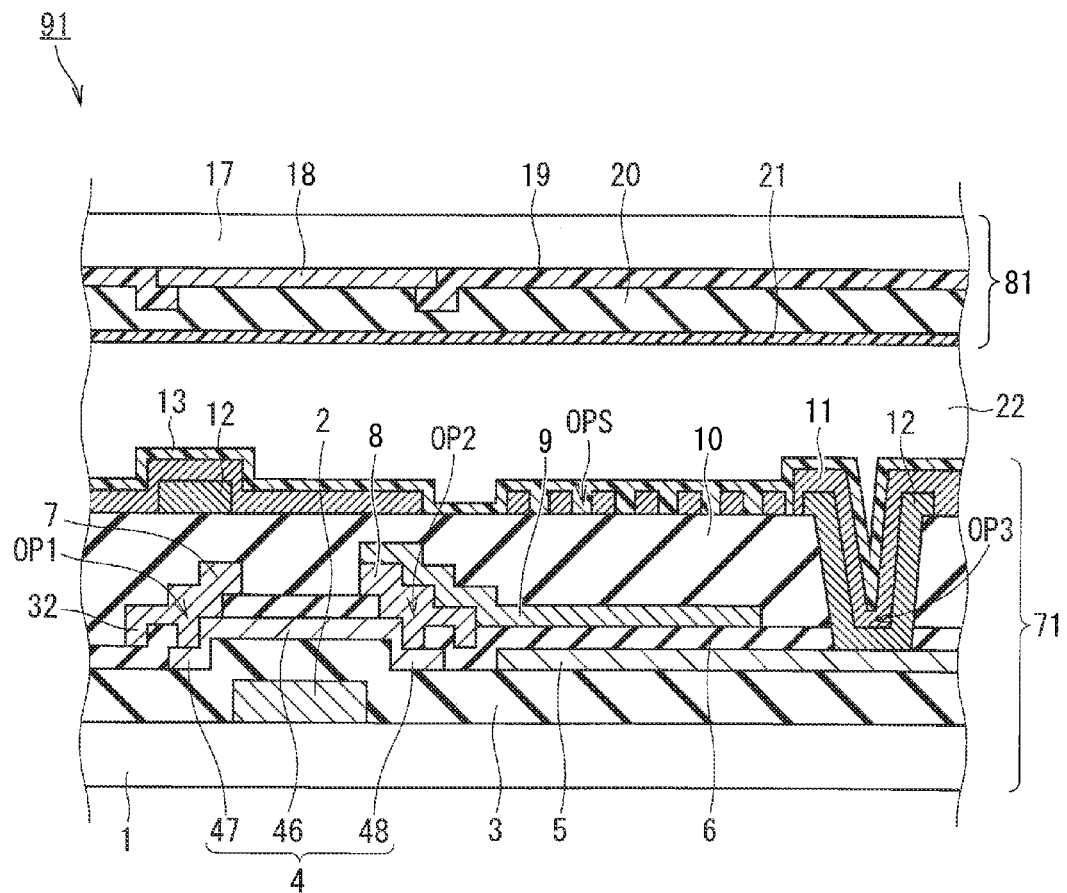

LIQUID CRYSTAL DISPLAY DEVICE AND MANUFACTURING METHOD THEREOF

BACKGROUND OF THE INVENTION

Field of the Invention

The present invention relates to a liquid crystal display device and a manufacturing method thereof.

Description of the Background Art

As a display device, there is known an active matrix display device including a large number of pixels that are arranged in a matrix. The active matrix display device includes, for each pixel, a thin film transistor (TFT), which is a thin film semiconductor element, so that each pixel may be driven independently. Conventionally, as a semiconductor of a channel layer of the TFT for display use, amorphous silicon (a-Si) is often used. In recent years, with an increasing demand for high definition, an oxide semiconductor with higher mobility is starting to be used instead of a-Si.

As the active matrix display device, a liquid crystal display device, which is a display device that uses liquid crystal, is widely used. This device generally includes a pair of transparent substrates that are adhered to each other, and a liquid crystal composition sealed between the pair. The pair of transparent substrates is formed from a TFT substrate and a counter substrate. The TFT substrate includes a TFT for each pixel. The counter substrate may be provided with a color filter.

Liquid crystal display devices are roughly categorized into that of a longitudinal electric field method and that of a lateral electric field method. According to the longitudinal electric field, a pixel electrode is provided to one of the pair of transparent substrates (for example, the TFT substrate), and a common electrode is provided to the other of the pair (for example, the counter substrate). According to the lateral electric field method, both the pixel electrode and the common electrode are provided on one of the pair of transparent substrates (for example, the TFT substrate). For example, according to a fringe field switching (FFS) method, which is a type of the lateral electric field method, these electrodes are disposed on different layers of the same substrate. According to the FFS method, low voltage driving is possible, and also, a wide viewing angle and high contrast are achieved, and moreover, transmittance is high and bright display is enabled.

Furthermore, the liquid crystal display devices may be categorized into a transmissive type, a reflective type, and a semi-transmissive type having both features of the transmissive type and the reflective type. The transmissive type includes transparent electrodes as a pixel electrode and a common electrode, and performs display by transmitting light from a backlight device. The reflective type includes a reflective electrode as at least one of the pixel electrode and the common electrode, and performs display by reflecting light from a front light device or external environment.

Generally, the liquid crystal display device includes a storage capacitance for each pixel. The storage capacitance is mainly used to prevent the voltage of a pixel electrode from being affected by feed-through voltage caused by a change in the voltage on a scanning line or a signal line in a storage period when the TFT is in an off state. If a storage capacitance that is sufficiently larger than a parasitic capacitance is not secured, a phenomenon called flicker or burn-in may be caused due to the influence of the feed-through voltage. This may result in reduced image quality of the display device.

The following contents are disclosed by the description of Japanese Patent Application Laid-Open No. 2-81029 (1990). In a liquid crystal display device, an auxiliary capacitance electrode is disposed facing a display electrode across a storage capacitance (auxiliary capacitance) insulating film. In the manufacturing method, a gate insulating film and the auxiliary capacitance insulating film are formed from the same insulating film. Then, a part of the insulating film corresponding to the auxiliary capacitance insulating film is etched to a predetermined film thickness. According to this manufacturing method, the same insulating film is formed into an optimum film thickness for each of the gate insulating film and the auxiliary capacitance insulating film. Accordingly, at a part that is used as the gate insulating film, a sufficient film thickness may be secured so that short between a gate metal film and a drain/source metal film thereabove is not caused. Moreover, at a part that is used as the auxiliary capacitance insulating film, higher capacitance and reduced film thickness may be achieved, and there is no need to secure a large overlapping area between an auxiliary capacitance electrode and a display transparent electrode. This reduces a part where light is shielded by the gate metal layer and increases the aperture ratio of the pixel for an element structure where the gate metal film is used at the same time as an auxiliary capacitance.

With the transmissive liquid crystal display device, a high aperture ratio is desired so as to efficiently use light from a backlight. According to the technology described in Japanese Patent Application Laid-Open No. 2-81029 (1990), one of the electrodes forming the storage capacitance is made of a metal material, and because the material is opaque, light is blocked. Accordingly, with this technology, the effect of increasing the aperture ratio while securing the storage capacitance may not be sufficient. Accordingly, Japanese Patent Application Laid-Open No. 8-179363 (1996) discloses a liquid crystal display device, of the longitudinal electric field method, including a storage capacitance electrode of a transparent conductive material such as tin-doped indium oxide (ITO), tin oxide, or indium oxide, for example.

According to the FFS method, which is a type of the lateral electric field method, the overlapping area of a pixel electrode and a common electrode is great in plan view, and thus, a relatively large storage capacitance is secured by these electrodes alone. However, in recent years, the pixel size is reduced due to an ultra high definition liquid crystal display device, and it is becoming difficult to secure an area where electrodes can be formed. Accordingly, also with the FFS method, it is becoming difficult to secure a sufficient storage capacitance by the pixel electrode and the common electrode alone. Thus, Japanese Patent Application Laid-Open No. 2009-058913 separately provides a transparent storage capacitance electrode, for example.

In the case of applying the technology described in Japanese Patent Application Laid-Open No. 8-179363 (1996) or Japanese Patent Application Laid-Open No. 2009-058913 to a manufacturing method of a general TFT substrate, a deposition step and a patterning step have to be added to form a storage capacitance electrode. This results in increased manufacturing cost.

SUMMARY OF THE INVENTION

The present invention is for solving the problems described above, and has its object to provide a liquid crystal display device and a manufacturing method thereof which are capable of securing a large storage capacitance and a high aperture ratio while suppressing an increase in the manufacturing cost.

A liquid crystal display device includes a gate electrode, a first insulating film, an element layer, a first transparent electrode, and a second transparent electrode. The gate electrode is provided for each of a plurality of pixels. The first insulating film includes a part that covers the gate electrode. The element layer is directly disposed on the first insulating film, includes a channel region that faces the gate electrode across the first insulating film, and is made of a transparent oxide. The first transparent electrode is directly disposed on the first insulating film while being separated from the element layer, and has the same composition as the composition of the element layer. The second transparent electrode forms a storage capacitance with the first transparent electrode by facing the first transparent electrode while being electrically insulated from the first transparent electrode.

A manufacturing method of a liquid crystal display device includes the following steps. A gate electrode is formed for each of a plurality of pixels. A first insulating film that includes a part that covers the gate electrode is formed. A transparent oxide layer is deposited on the first insulating film. An element layer that includes a channel region that faces the gate electrode across the first insulating film, and a first transparent electrode that is separate the element layer are formed from the transparent oxide layer. A second transparent electrode that forms a storage capacitance with the first transparent electrode by facing the first transparent electrode while being electrically insulated from the first transparent electrode is formed.

According to the present invention, a large storage capacitance and a high aperture ratio may be secured while suppressing an increase in the manufacturing cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a partial cross-sectional view schematically showing a structure of a liquid crystal display device according to a first preferred embodiment of the present invention in a range corresponding to one pixel region, along line I-I (FIG. 2);

DESCRIPTION OF THE PREFERRED EMBODIMENTS

Figure 2:
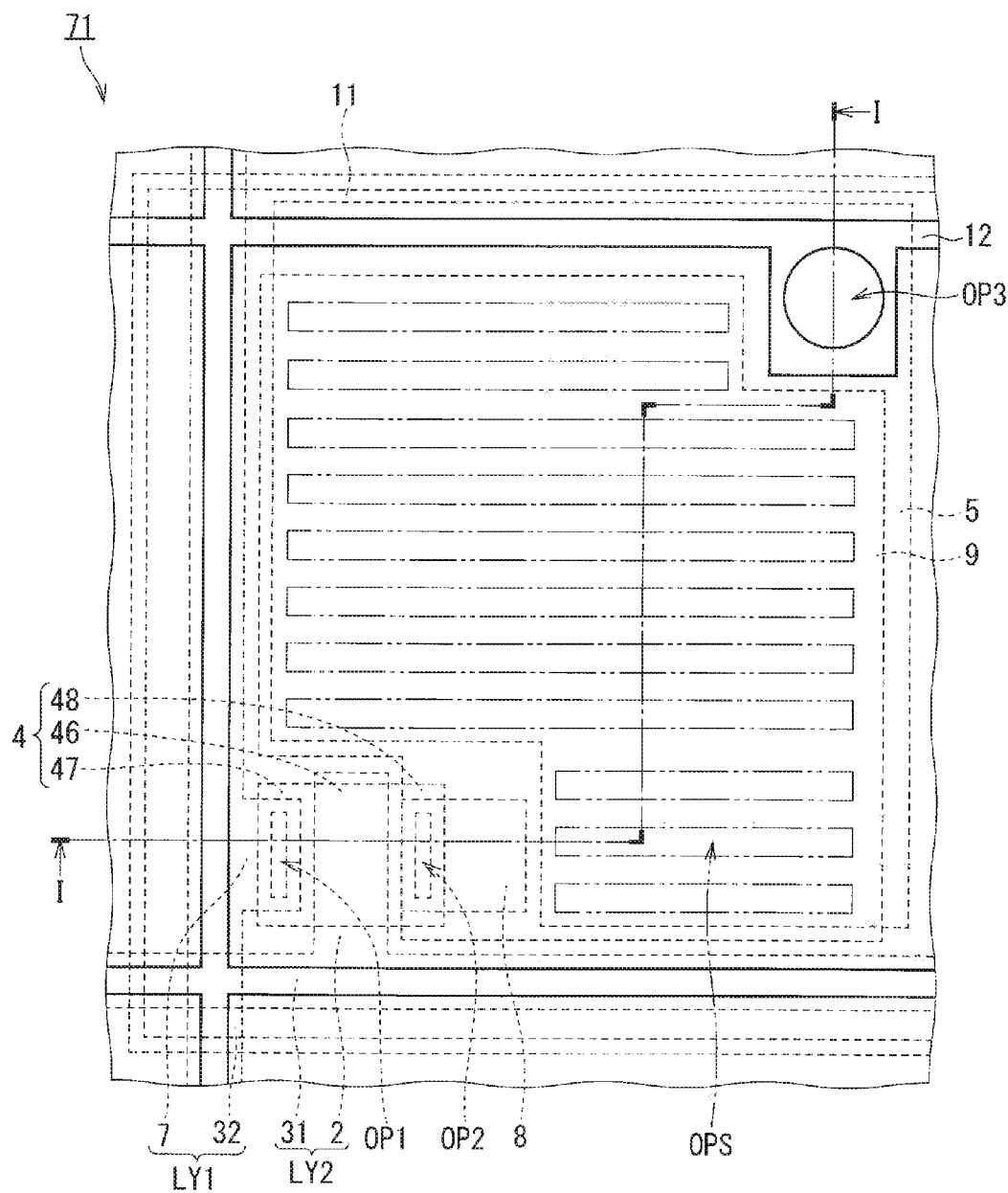
FIG. 2 is a partial plan view schematically showing a structure of a TFT substrate of the liquid crystal display device according to the first preferred embodiment of the present invention in a range corresponding to one pixel region.

Hereinafter, preferred embodiments of the present invention will be described with reference to the drawings. Additionally, in the following drawings, the same or corresponding parts are denoted by the same reference numeral, and redundant description is omitted.

First Preferred Embodiment (General Structure)

FIG. 1 is a partial cross-sectional view schematically showing a structure of a liquid crystal display device 91 of the present preferred embodiment in a range corresponding to one pixel region, along line I-I (FIG. 2). FIG. 2 is a partial plan view schematically showing a structure of a TFT substrate 71 of the liquid crystal display device 91 in a range corresponding to one pixel region. Additionally, in FIG. 2, for the sake of visibility, a first alignment film 13 (FIG. 1) is not shown, and also, only slit-shaped opening portions OPS are shown by two-dot chain lines for a third transparent electrode 11 (FIG. 1).

The liquid crystal display device 91 has an FFS structure. The liquid crystal display device 91 includes a TFT substrate 71 (an array substrate), a color filter (CF) substrate 81 (a counter substrate), and a liquid crystal layer 22. The liquid crystal layer 22 is provided between the TFT substrate 71 and the CF substrate 81. The thickness of the liquid crystal layer 22 is uniformly maintained by column-shaped spacers (not shown) provided between the TFT substrate 71 and the CF substrate 81.

The TFT substrate 71 includes a plurality of scanning wiring layers 31, and a plurality of signal wiring layers 32. The scanning wiring layers 31 are disposed in parallel to one another. The signal wiring layers 32 are disposed in parallel to one another. Each scanning wiring layer 31 intersects with the plurality of signal wiring layers 32. Each signal wiring layer 32 intersects with the plurality of scanning wiring layers 31. A transparent display region of the TFT substrate 71 is divided into a plurality of pixel regions by the scanning wring layers 31 and the signal wiring layers 32 disposed in the above manner.

(Structure of TFT Substrate 71)

The TFT substrate 71 includes a first transparent substrate 1, a gate electrode 2, a first insulating film 3, an element layer 4, a first transparent electrode 5, a second insulating film 6, a source electrode 7, a drain electrode 8, a second transparent electrode 9, a third insulating film 10, a third transparent electrode 11, a common electrode wiring layer 12, a first alignment film 13, a scanning wiring layer 31, and a signal wiring layer 32. The source electrode 7 and the signal wiring layer 32 are integrally formed as a first conductive layer LY1. Accordingly, voltage is applied to the source electrode 7 through the signal wiring layer 32. The gate electrode 2 and the scanning wiring layer 31 are integrally formed as a second conductive layer LY2. Accordingly, voltage is applied to the gate electrode 2 through the scanning wiring layer 31. In each pixel region, a TFT is formed by the gate electrode 2, the first insulating film 3 as a gate insulating film, the element layer 4 forming a channel, the source electrode 7, and the drain electrode 8.

The first transparent substrate 1 is a base of the TFT substrate 71. The first transparent substrate 1 is made of a transparent insulating material, and as the transparent insulating material, glass, quartz, or plastic may be used, for example.

The second conductive layer LY2 including the gate electrode 2 and the scanning wiring layer 31 is disposed on a surface, of the first transparent substrate 1, facing the liquid crystal layer 22. The gate electrode 2 is provided to each of a plurality of pixels. Specifically, in each pixel region, the gate electrode 2 extends from the scanning wiring layer 31 toward the TFT. Accordingly, in the second conductive layer LY2, the width of a part where the scanning wiring layer 31 and the gate electrode 2 are combined (the dimension in the longitudinal direction in FIG. 2) is greater than the width of a part where only the scanning wiring layer 31 extends. The second conductive layer LY2 is made of a metal material, and as the metal material, copper (Cu), aluminum (Al), titanium (Ti), molybdenum (Mo), tungsten (W), or chromium (Cr) may be used, for example.

The first insulating film 3 covers a surface, of the first transparent substrate 1, where the second conductive layer LY2 is provided. Accordingly, the first insulating film 3 includes a part that covers the gate electrode 2. The first insulating film 3 is made of silicon oxide ($SiO_x$), silicon nitride ($SiN_x$), silicon oxynitride (SiON), or a laminate thereof, for example.

The element layer 4 is directly disposed on the first insulating film 3. The element layer 4 includes a first end portion 47 (a left end portion in FIG. 1), a second end portion 48 (a right end portion in FIG. 1), and a channel region 46 separating the end portions. The channel region 46 faces the gate electrode 2 across the first insulating film 3. Accordingly, of the first insulating film 3, the part that is sandwiched by the channel region 46 and the gate electrode 2 functions as a gate insulating film.

The element layer 4 is made of a transparent oxide. As the transparent oxide, a material including at least one element among indium (In), gallium (Ga), zinc (Zn), and tin (Sn) may be used. As the transparent oxide, indium gallium zinc oxide (IGZO), indium gallium oxide (IGO), indium zinc oxide (IZO), indium tin zinc oxide (ITZO), tin zinc oxide (TZO), or zinc oxide (ZnO) may be used, for example.

The first transparent electrode 5 is disposed directly on the first insulating film 3, away from the element layer 4, in the transparent display region of the TFT substrate 71. The first insulating film 3 continuously extends between a part, of the first insulating film 3, in contact with the element layer 4 and a part, of the first insulating film 3, in contact with the first transparent electrode 5. In other words, the element layer 4 and the first transparent electrode 5 are both directly disposed on the common first insulating film 3. The element layer 4 and the first transparent electrode 5 are disposed in a same layer between the first insulating film 3 and the second insulating film 6. Additionally, the first transparent electrode 5 and the first transparent substrate 1 are preferably separated only by an insulating body. In other words, a non-insulating member (a conductive member) forming an electrical path is preferably not disposed between the first transparent electrode 5 and the first transparent substrate 1. For example, according to the structure shown in FIG. 1, the first transparent electrode 5 and the first transparent substrate 1 are separated only by the first insulating film 3.

The first transparent electrode 5 is made of a transparent oxide, and has the same composition as the composition of the element layer 4. The reason is that, as will be described in detail later, in the manufacturing of the TFT substrate 71, a transparent oxide layer 40 (FIG. 5) including parts to be the first transparent electrode 5 and the element layer 4 is deposited on the first insulating film 3, and the first transparent electrode 5 and the element layer 4 are formed at the same time by patterning of the transparent oxide layer 40. However, the electron carrier concentration of the first transparent electrode 5 is preferably higher than the electron carrier concentration of the channel region 46 of the element layer 4 due to selective irradiation with energy rays. In this case, due to the difference in the electron carrier concentrations, the first transparent electrode 5 has a lower resistance than the channel region 46 of the element layer 4.

In the present specification, to "have the same composition" means that at least the metal composition is the same. The metal composition is the ratio of metal atoms (for example, In, Ga, Zn, and Sn) which are the main structural elements of a transparent oxide, other than oxygen. On the other hand, the ratio of hydrogen atoms is not taken into account as a composition. The hydrogen atoms possibly exist in an oxide by being mixed as impurities or by being coupled to a local defect. Moreover, the ratio of oxygen atoms in the oxide varies due to various factors after deposition, and does not have to be taken into account as a composition. Alternatively, the ratio of oxygen atoms in the oxide may be taken into account as a composition by taking the amount of variation caused by a treatment step after deposition, such as a radiation step of energy rays described later, as an error.

The second insulating film 6 includes a part that covers the channel region 46 of the element layer 4, and a part that separates the first transparent electrode 5 and the second transparent electrode 9. Of the second insulating film 6, the part formed on the channel region 46 of the element layer 4 functions as a channel protection film (an etch stopper film) in a manufacturing step of the liquid crystal display device 91 (the TFT substrate 71). The material of the second insulating film 6 may be selected from the same material group as that of the first insulating film 3 described above. The second insulating film 6 is thinner than the first insulating film 3. The second insulating film 6 is provided with a first opening portion OP1 for at least partially exposing the first end portion 47, and a second opening portion OP2 for at least partially exposing the second end portion 48. Moreover, a third opening portion OP3 for partially exposing the first transparent electrode 5 is provided to a laminate of the second insulating film 6 and the third insulating film 10.

The source electrode 7 is connected to the first end portion 47 of the element layer 4 through the first opening portion OP1. The drain electrode 8 is connected to the second end portion 48 of the element layer 4 through the second opening portion OP2. The first conductive layer LY1 including the source electrode 7 also includes the signal wiring layer 32. The signal wiring layer 32 is disposed intersecting the scanning wiring layer 31 in plan view (FIG. 2), and in the drawing, the layers are orthogonal to each other. The material of the first conductive layer LY1 may be selected from the same material group as that of the second conductive layer LY2 described above.

The second transparent electrode 9 is in contact with the drain electrode 8 by having a part that is disposed on the drain electrode 8. Voltage may thereby be applied to the second transparent electrode via the TFT. The second transparent electrode thus functions as a pixel electrode. Also, the second transparent electrode 9 faces the first transparent electrode 5 while being electrically insulated from the first transparent electrode 5 by the second insulating film 6. The second transparent electrode 9 thus forms a storage capacitance together with the first transparent electrode 5. The second transparent electrode 9 is separated from the third opening portion OP3. The second transparent electrode 9 is thereby insulated from the common electrode wiring layer 12 by the third insulating film 10. The second transparent electrode 9 is made of a conductive material of a transparent oxide, and is made of tin-doped indium oxide (ITO), indium oxide (InO), tin oxide (SnO), indium zinc oxide (IZO), or zinc oxide (ZnO), for example.

The third insulating film 10 covers the second transparent electrode 9. The third insulating film 10 also covers the TFT structure. As described above, the TFT structure includes the source electrode 7, the drain electrode 8, and the channel region 46, which is protected by the second insulating film 6. Also, as described above, the laminate of the second insulating film 6 and the third insulating film 10 is provided with the third opening portion OP3 which partially exposes the first transparent electrode 5. The material of the third insulating film 10 may be selected from the same material group as that of the first insulating film 3 and the second insulating film 6.

The common electrode wiring layer 12 is provided on the third insulating film 10. The common electrode wiring layer 12 includes a part that extends in parallel with the scanning wiring layer 31 so as to intersect with the signal wiring layer 32 (the part extending in the lateral direction in FIG. 2). The common electrode wiring layer 12 is electrically shorted to the first transparent electrode 5 by being in contact with the first transparent electrode 5 through the third opening portion OP3. The common electrode wiring layer 12 is electrically connected to the third transparent electrode 11 as a counter electrode and a storage capacitance electrode so as to reduce the resistance of the counter electrode and the storage capacitance electrode. Also, the common electrode wiring layer 12 is electrically connected to the first transparent electrode 5 as a storage capacitance electrode so as to reduce the resistance of the storage capacitance electrode. Moreover, the common electrode wiring layer 12 includes a part that extends in parallel to the signal wiring layer 32 so as to intersect with the scanning wiring layer 31 (the part extending in the longitudinal direction in FIG. 2), and this part is disposed along the path of the signal wiring layer 32 in plan view. The resistance of the common electrode wiring layer 12 is thereby reduced. The material of the common electrode wiring layer 12 may be selected from the same metal material group as that of the second conductive layer LY2.

The third transparent electrode 11 is in contact with the common electrode wiring layer 12 by being disposed to cover the third opening portion OP3. The third transparent electrode 11 and the common electrode wiring layer 12 are thereby shorted with each other. The third transparent electrode 11 is provided on the third insulating film 10. In other words, the third transparent electrode 11 is provided on the second transparent electrode 9 across the third insulating film 10. The third transparent electrode 11 thus functions as a counter electrode of the second transparent electrode 9 as a pixel electrode. Also, the third transparent electrode 11 includes a plurality of slit-shaped opening portions OPS that are in parallel to one another, in the transparent display region of the TFT substrate 71. An electric field for FFS may thereby be generated by the second transparent electrode 9 and the third transparent electrode 11. Specifically, an electric field with a component that is parallel to the surface of the TFT substrate 71 may be generated by applying voltage to between the third transparent electrode 11 including the slit-shaped opening portions OPS and the second transparent electrode 9. The liquid crystal layer 22 is thereby driven. The third transparent electrode 11 functions as a counter electrode, and also, forms a second storage capacitance with the second transparent electrode 9 via the third insulating film 10. The third transparent electrode 11 is made of a conductive material of a transparent oxide, and may be formed of a material selected from the same conductive material group as that of the second transparent electrode 9. Additionally, the third transparent electrode 11 and the common electrode wiring layer 12 may be formed in a reverse order as long as the two are electrically connected.

The first alignment film 13 is provided on an outermost surface of the TFT substrate 71. The first alignment film 13 has a function of aligning the liquid crystal layer 22 in a predetermined direction.

Additionally, the first transparent electrode 5 may include, in addition to the part including the structures described above (the part shown in FIG. 1), a part that is separated from the aforementioned part and that is disposed in a region corresponding to the signal wiring layer 32. In this case, the signal wiring layer 32 is formed, on the first transparent substrate 1, by a laminate film in which a part of the first transparent electrode 5 and a part of the first conductive layer LY1 (FIG. 2) are laminated in this order. This laminate structure increases the redundancy of the signal wiring layer 32, and thus, a defect caused by disconnection or the like may be prevented. With the signal wiring layer 32 in this case, the second insulating film 6 is not formed between the first transparent electrode 5 and the first conductive layer LY1, and the first transparent electrode 5 and the first conductive layer LY1 have to be in direct contact with each other. Of the first transparent electrode 5, the part forming the signal wiring layer 32 may be reduced in resistance, by irradiation with energy rays 44 (FIG. 9) via the first transparent substrate 1 described below, except for the part intersecting with the scanning wiring layer 31, and may sufficiently function as redundant wiring.

Furthermore, a light shielding film may be provided by extending at least one of the source electrode 7, the drain electrode 8, and the common electrode wiring layer 12 to above the channel region 46. A shift in the TFT properties due to incident light on the channel region 46 may thereby be reduced.

(Structures of Other than TFT Substrate 71)

The CF substrate 81 includes a second transparent substrate 17, a light shielding film 18, a CF 19, a protection film 20, and a second alignment film 21. The light shielding film 18 is disposed on a surface, of the second transparent substrate 17, facing the liquid crystal layer 22. The CF 19 has a predetermined color on a per-pixel basis for color display. A retarder and a polarizer (not shown) are disposed outside the TFT substrate 71 and the CF substrate 81. Also, a drive circuit (not shown) is connected to each of the scanning wiring layer 31, the signal wiring layer 32, and the common electrode wiring layer 12 of the TFT substrate 71.

(Manufacturing Method)

Next, a manufacturing method of the liquid crystal display device 91 will be described below.

Figure 3:
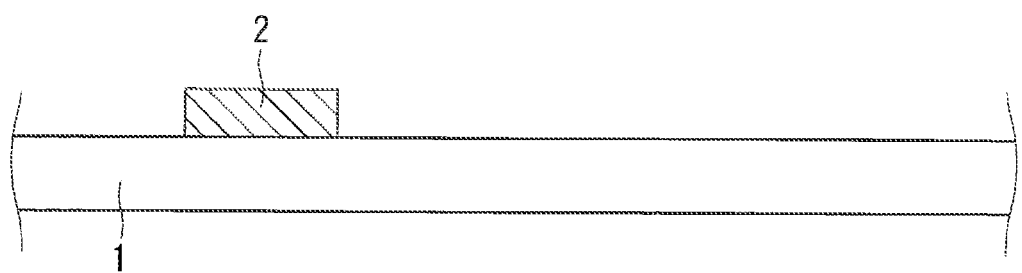
FIG. 3 is a partial cross-sectional view schematically showing a first step of a manufacturing method of the liquid crystal display device according to the first preferred embodiment of the present invention in a view corresponding to FIG. 1.

Referring to FIG. 3, a glass substrate is prepared as the first transparent substrate 1, for example. Next, an Al film of a thickness of about 300 nm is deposited, as a metal layer, on an entire surface of the first transparent substrate 1 by sputtering. Then, a photosensitive resin film (not shown) is applied on the Al film by spin coating. Then, the photosensitive resin film is patterned by using a first photo mask (not shown), and a first resist pattern (not shown) is thereby formed. Furthermore, an unnecessary portion, of the Al film, exposed from the first resist pattern is removed by wet etching. Then, the first resist pattern is peeled off. Accordingly, the second conductive layer LY2 (FIG. 2) including the gate electrode 2 (FIG. 3) disposed in each of a plurality of pixels is formed on the first transparent substrate 1. Additionally, a PAN (Phosphoric, Acetic and Nitric acids) solution, which is a mixed acid of phosphoric acid, acetic acid and nitric acid, may be used for wet etching of the Al film, for example.

Figure 4:
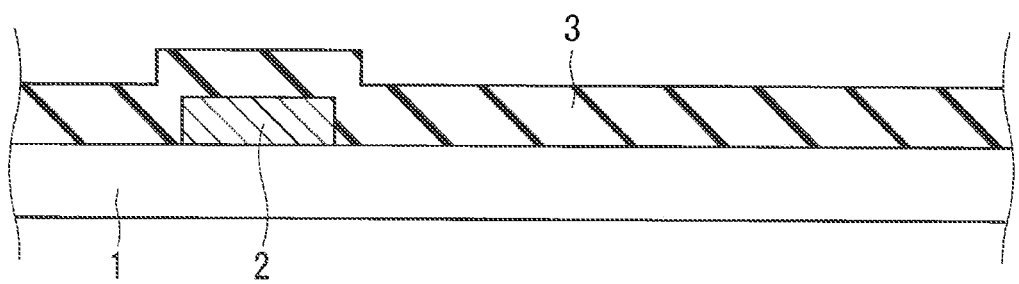
FIG. 4 is a partial cross-sectional view schematically showing a second step of the manufacturing method of the liquid crystal display device according to the first preferred embodiment of the present invention in the view corresponding to FIG. 1.

Referring to FIG. 4, the first insulating film 3 is formed on the entire surface of the first transparent substrate 1 (FIG. 3) where the second conductive layer LY2 (FIG. 2) including the gate electrode 2 and the scanning wiring layer 31 is provided. Accordingly, the first insulating film 3 includes a part that covers the gate electrode 2, and a part that covers the scanning wiring layer 31. For example, as the first insulating film 3, a SiN film of a thickness of about 400 nm is deposited by plasma chemical vapor deposition (CVD).

Figure 5:
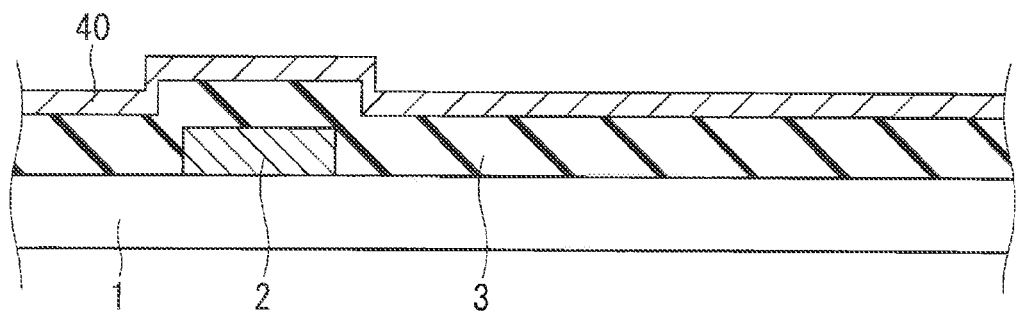
FIG. 5 is a partial cross-sectional view schematically showing a third step of the manufacturing method of the liquid crystal display device according to the first preferred embodiment of the present invention in the view corresponding to FIG. 1.

Referring to FIG. 5, the transparent oxide layer 40 including parts to be the element layer 4 and the first transparent electrode 5 (FIG. 1) is deposited on substantially the entire surface of the first insulating film 3. For example, as the transparent oxide layer 40, an IGZO film of a thickness of about 80 nm is formed by sputtering.

Figure 6:
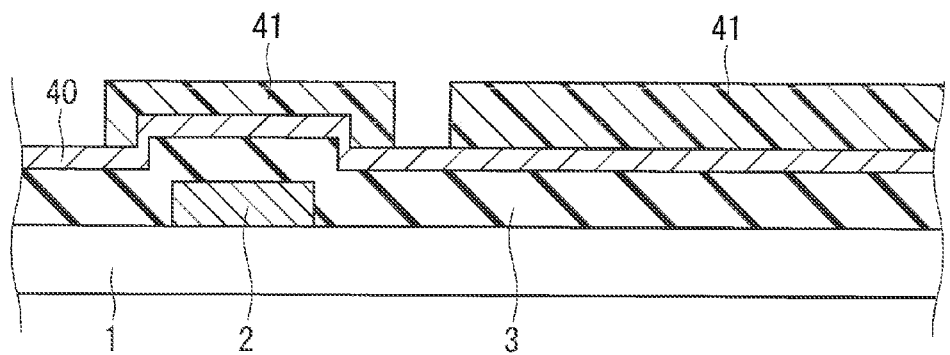
FIG. 6 is a partial cross-sectional view schematically showing a fourth step of the manufacturing method of the liquid crystal display device according to the first preferred embodiment of the present invention in the view corresponding to FIG. 1.

Referring to FIG. 6, a photosensitive resin film (not shown) is applied by spin coating to the entire surface of the first transparent substrate 1 where the transparent oxide layer 40 is provided. Then, the photosensitive resin film is patterned by using a second photo mask (not shown), and a second resist pattern 41 (a mask layer) having a pattern corresponding to the element layer 4 and the first transparent electrode 5 (FIG. 1) is thereby formed on the transparent oxide layer 40. An unnecessary portion, of the transparent oxide layer 40, exposed from the second resist pattern 41 is removed by wet etching. That is, patterning of the transparent oxide layer 40 is performed by using the second resist pattern 41. Then, the second resist pattern 41 is removed.

Figure 7:
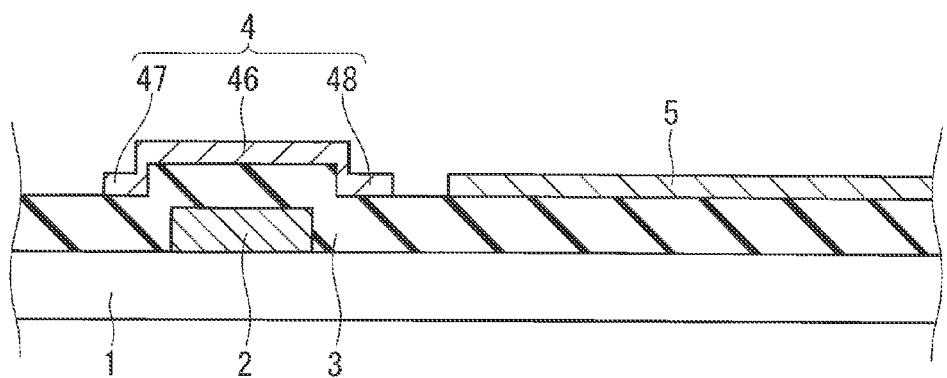
FIG. 7 is a partial cross-sectional view schematically showing a fifth step of the manufacturing method of the liquid crystal display device according to the first preferred embodiment of the present invention in the view corresponding to FIG. 1.

Referring to FIG. 7, the element layer 4 and the first transparent electrode 5 are formed from the transparent oxide layer 40 (FIG. 6) by the patterning described above. More specifically, the element layer 4 including the channel 46 facing the gate electrode 2 across the first insulating film 3, and the first transparent electrode 5 separated from the element layer 4 are formed.

Figure 8:
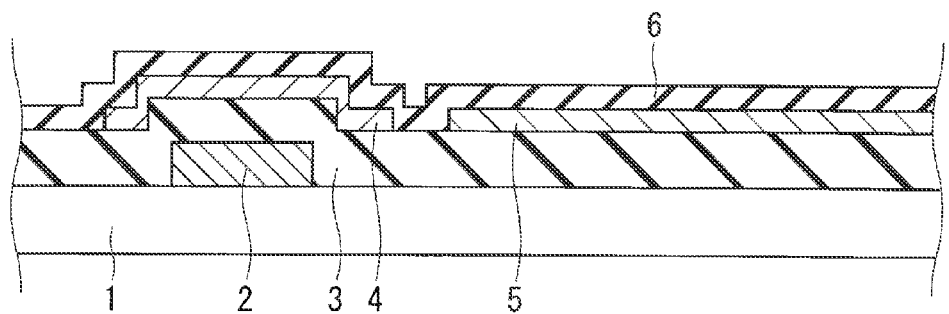
FIG. 8 is a partial cross-sectional view schematically showing a sixth step of the manufacturing method of the liquid crystal display device according to the first preferred embodiment of the present invention in the view corresponding to FIG. 1.

Referring to FIG. 8, the second insulating film 6 is formed on the entire surface of the first transparent substrate 1 where the element layer 4 and the first transparent electrode 5 are provided. For example, as the second insulating film 6, a SiN film of a thickness of about 100 nm is formed by plasma CVD.

Figure 9:
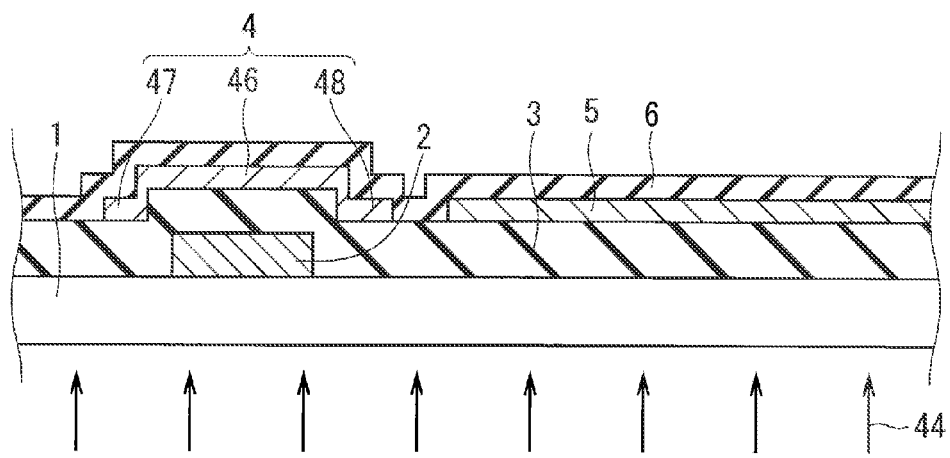
FIG. 9 is a partial cross-sectional view schematically showing a seventh step of the manufacturing method of the liquid crystal display device according to the first preferred embodiment of the present invention in the view corresponding to FIG. 1.

Referring to FIG. 9, energy rays 44 are radiated on the first transparent electrode 5. For example, ultraviolet rays are radiated as the energy rays 44. The resistance of the first transparent electrode 5 is thereby reduced. Some transparent oxide materials, typified by IGZO, normally show properties of a semiconductor, but are known to have the resistance reduced by an increase in the conductivity caused by irradiation with energy rays, such as ultraviolet rays. The reason is assumed to be that, when irradiated with energy rays, the oxygen-oxygen bond or metal-oxygen bond in the transparent oxide is partially broken, and a defect level (where surplus electrons not contributing to bonding are present) is generated, and electron carriers are thereby generated.

In the step of reducing the resistance of the first transparent electrode 5 described above, the channel region 46 of the element layer 4 is shielded from the energy rays 44 by the gate electrode 2. In other words, at the time of irradiation with the energy rays 44, the gate electrode 2 functions as a mask for the channel region 46 of the element layer 4. Accordingly, at the time of irradiation with the energy rays 44, the resistance of the channel region 46 of the element layer 4 is approximately maintained. On the other hand, the first end portion 47 and the second end portion 48 of the element layer 4 are irradiated with the energy rays 44 in the same manner as the first transparent electrode 5. Accordingly, the resistance of the first end portion 47 and the second end portion 48 is reduced in the same manner as the resistance of the first transparent electrode 5. The contact resistances between the first end portion 47 and the source electrode 7 and between the second end portion 48 and the drain electrode 8 are thereby reduced. The electrical properties of the TFT are thereby improved.

Additionally, at the time of irradiation with the energy rays 44, if, unlike in FIG. 1, a conductive member as a transparent electrode or a metal electrode is present between the first transparent substrate 1 and the first transparent electrode 5, the energy rays are absorbed or reflected before reaching the first transparent electrode 5 and are greatly attenuated. If the intensity of the energy rays is increased to compensate for the attenuation, the transparent electrode or the metal electrode may be damaged. Therefore, the first transparent electrode 5, which is formed at the same time as the element layer 4, is preferably disposed at a position, in the transparent display region of the TFT substrate 71, closest to the first transparent substrate 1 among the conducting members (i.e. non-insulating members) forming the electrical path. Additionally, if the radiation direction of the energy rays is made an opposite direction, such a consideration for the arrangement becomes unnecessary. In this case, a light shielding mask is provided on a region including the channel region 46, and then, the energy rays are radiated on the surface of the first transparent substrate 1 where the first transparent electrode 5 is provided, without passing through the first transparent substrate 1. Therefore, a step for providing the light shielding mask for shielding the channel region 46 from light becomes necessary before irradiation with the energy rays.

Figure 10:
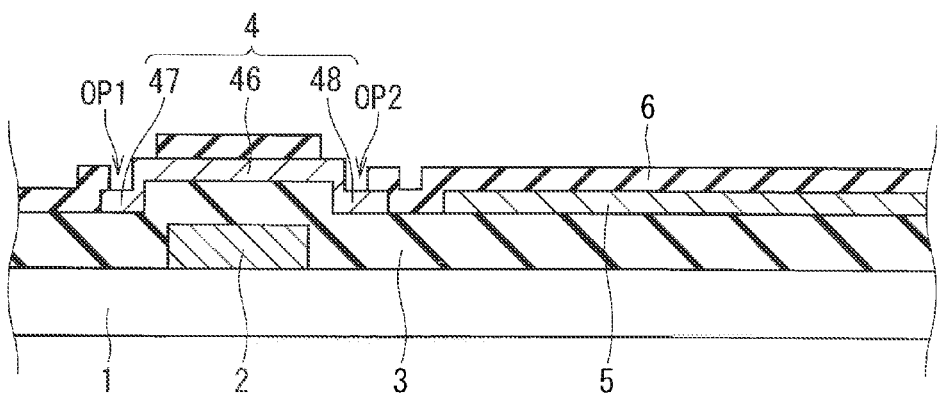
FIG. 10 is a partial cross-sectional view schematically showing an eighth step of the manufacturing method of the liquid crystal display device according to the first preferred embodiment of the present invention in the view corresponding to FIG. 1.

Referring to FIG. 10, a photosensitive resin film (not shown) is applied by spin coating on the entire surface of the first transparent substrate 1 where the second insulating film 6 is formed. Then, the photosensitive resin film is patterned by using a third photo mask (not shown), and a third resist pattern (not shown) is thereby formed. Moreover, an unnecessary portion, of the second insulating film 6, exposed from the third resist pattern is removed by dry etching. The second insulating film 6 is thereby patterned into a desired shape. That is, the first opening portion OP1 and the second opening portion OP2 are formed to the second insulating film 6.

Figure 11:
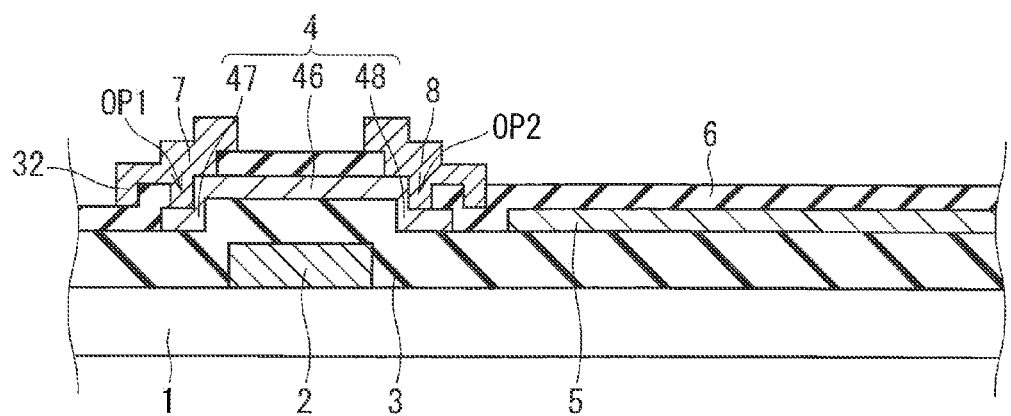
FIG. 11 is a partial cross-sectional view schematically showing a ninth step of the manufacturing method of the liquid crystal display device according to the first preferred embodiment of the present invention in the view corresponding to FIG. 1.

Referring to FIG. 11, a metal film is formed on the entire surface of the first transparent substrate 1 where the second insulating film 6 is provided. For example, an Al film of a thickness of 300 nm is formed by sputtering. The metal film includes parts to be filled into the first opening portion OP1 and the second opening portion OP2. Then, a photosensitive resin film (not shown) is applied by spin coating on the entire surface of the first transparent substrate 1 where the metal film is provided. Then, the photosensitive resin film is patterned by using a fourth photo mask (not shown), and a fourth resist pattern (not shown) is thereby formed. Furthermore, an unnecessary portion, of the metal film, exposed from the fourth resist pattern is removed by etching. The metal film is thereby patterned into a desired shape. That is, the signal wiring layer 32 and the source electrode 7, which are integrated with each other, and the drain electrode 8 are formed from the metal film.

The etching described above may be performed by wet etching. In the case where the metal film is an Al, a PAN solution may be used as the etching solution. Generally, an oxide semiconductor is not resistant to an acid solution such as the PAN solution. Accordingly, the oxide semiconductor is greatly etched when coming into contact with the PAN solution. Therefore, it is difficult to secure etch selectivity between the metal film and an oxide semiconductor layer at the time of patterning of the metal film using the etching solution. In the present preferred embodiment, the second insulating film 6 is provided on the channel region 46 formed of an oxide semiconductor, and this functions as a channel protection film (an etch stopper layer). Accordingly, damage on the back channel side of the channel region 46 in the metal film etching step may be suppressed. In other words, the TFT of the TFT substrate 71 (FIG. 1) has an etch stopper structure.

Figure 12:
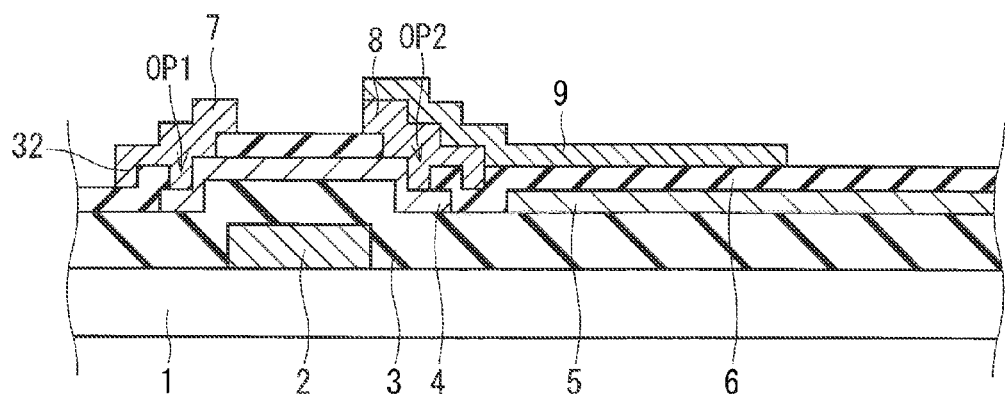
FIG. 12 is a partial cross-sectional view schematically showing a tenth step of the manufacturing method of the liquid crystal display device according to the first preferred embodiment of the present invention in the view corresponding to FIG. 1.

Referring to FIG. 12, a second transparent oxide film is formed on the entire surface of the first transparent substrate 1 where the source electrode 7, the drain electrode 8, and the signal wiring layer 32 are provided. For example, as the second transparent oxide film, an ITO film of a thickness of 100 nm is formed by sputtering. Moreover, a photosensitive resin film (not shown) is applied by spin coating on the entire surface of the first transparent substrate 1 where the second transparent oxide film is provided. Then, the photosensitive resin film is patterned by using a fifth photo mask (not shown), and a fifth resist pattern (not shown) is thereby formed. Furthermore, an unnecessary portion, of the second transparent oxide film, exposed from the fifth resist pattern is removed by wet etching. The second transparent oxide film is thereby patterned into a predetermined shape. That is, the second transparent electrode 9 is formed. The second transparent electrode 9 forms a storage capacitance together with the first transparent electrode 5 by facing the first transparent electrode 5 while being electrically insulated from the first transparent electrode 5.

Figure 13:
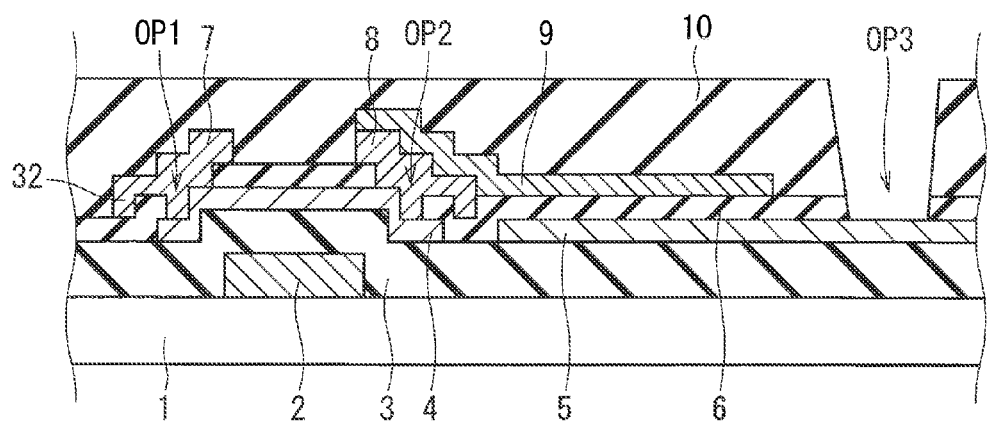
FIG. 13 is a partial cross-sectional view schematically showing an eleventh step of the manufacturing method of the liquid crystal display device according to the first preferred embodiment of the present invention in the view corresponding to FIG. 1.

Referring to FIG. 13, the third insulating film 10 is formed on the entire surface of the first transparent substrate 1 where the second transparent electrode 9 is provided. For example, a SiN film of a thickness of 400 nm is deposited by plasma CVD. A photosensitive resin film (not shown) is applied by spin coating on the entire surface of the first transparent substrate 1 where the third insulating film 10 is provided. Then, the photosensitive resin film is patterned by using a sixth photo mask (not shown), and a sixth resist pattern (not shown) is thereby formed. Furthermore, an unnecessary portion, of the laminate of the third insulating film 10 and the second insulating film 6, exposed from the sixth resist pattern is removed by dry etching. The third insulating film 10 and the second insulating film 6 are thereby patterned into predetermined shapes. That is, the third opening portion OP3 that partially exposes the first transparent electrode 5 is formed to the laminate of the third insulating film 10 and the second insulating film 6.

Figure 14:
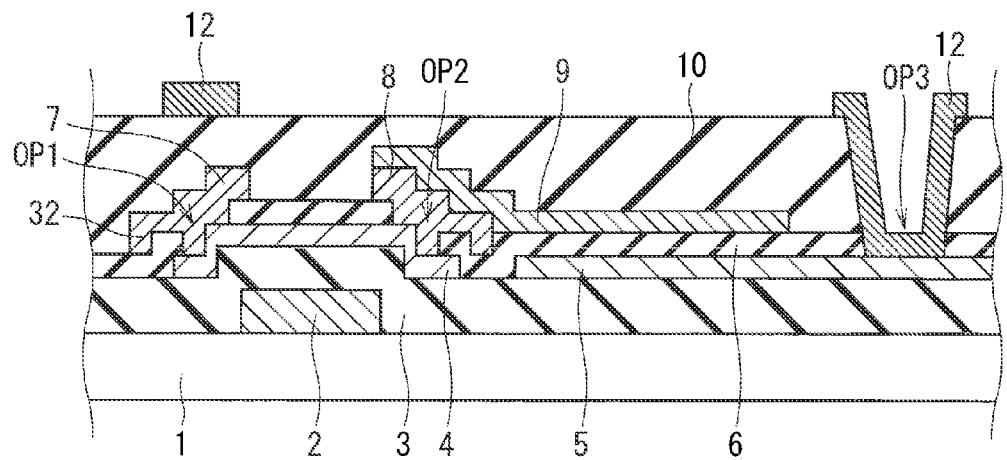
FIG. 14 is a partial cross-sectional view schematically showing a twelfth step of the manufacturing method of the liquid crystal display device according to the first preferred embodiment of the present invention in the view corresponding to FIG. 1.

Referring to FIG. 14, a metal layer including a part to be the common electrode wiring layer 12 is formed on the entire surface of the first transparent substrate 1 where the third insulating film 10 is provided. At this time, the metal layer is formed to cover the third opening portion OP3. Accordingly, the metal layer is connected to the first transparent electrode 5. For example, as the metal layer, an Al film of a thickness of 300 nm is formed by sputtering. Then, a photosensitive resin film (not shown) is applied by spin coating on the entire surface of the first transparent substrate 1 where the metal layer is provided. Then, the photosensitive resin film is patterned by using an eighth photo mask, and an eighth resist pattern (not shown) is thereby formed. Furthermore, an unnecessary portion, of the metal layer, exposed from the eighth resist pattern is removed by wet etching. The metal layer is thereby patterned into a predetermined shape. That is, the common electrode wiring layer 12 is formed.

Figure 15:
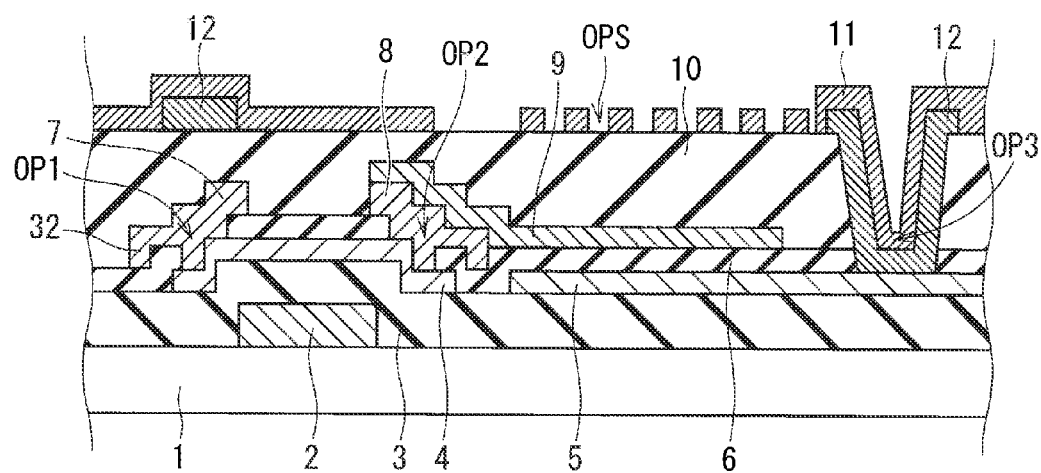
FIG. 15 is a partial cross-sectional view schematically showing a thirteenth step of the manufacturing method of the liquid crystal display device according to the first preferred embodiment of the present invention in the view corresponding to FIG. 1.

Referring to FIG. 15, a third transparent oxide film including a part to be the third transparent electrode 11 is formed on the entire surface of the first transparent substrate 1 where the common electrode wiring layer 12 is provided. For example, as the third transparent oxide film, an ITO film of a thickness of 100 nm is formed by sputtering. The third transparent oxide film includes a part that is formed on the common electrode wiring layer 12. Furthermore, a photosensitive resin film (not shown) is applied by spin coating on the entire surface of the first transparent substrate 1 where the third transparent oxide film is provided. Then, the photosensitive resin film is patterned into a comb shape by using a seventh photo mask (not shown). A seventh resist pattern (not shown) is thereby formed. Furthermore, an unnecessary portion, of the third transparent oxide film, exposed from the seventh resist pattern is removed by wet etching. The third transparent oxide film is thereby patterned into a predetermined shape. That is, the third transparent electrode 11 is formed.

Referring back to FIG. 1, the TFT 71 is obtained by forming the first alignment film 13. The CF substrate 81 is attached to the TFT substrate 71. The liquid crystal layer 22 is provided between these substrates. The liquid crystal display device 91 is obtained in the above manner.

Additionally, a case is described above where irradiation with the energy rays 44 (FIG. 9) is performed immediately after deposition of the second insulating film 6. However, the timing of irradiation is not limited thereto. Irradiation with the energy rays may be performed at an arbitrary timing after deposition of the transparent oxide layer 40 including parts to be the element layer 4 and the first transparent electrode 5. However, the present inventors have experimentally found that the effect of reduction, by irradiation with ultraviolet rays or the like, in the resistance of a semiconductor film of a transparent oxide material including at least one of indium (In), gallium (Ga), zinc (Zn), and tin (Sn) is great in a state where the semiconductor film is sandwiched by insulating films of SiN, SiO, or SiON formed by CVD, compared to a state of only the semiconductor film. The theoretical mechanism is not perfectly clear, but the present inventors have made the following presumption. In the case where an insulating film of SiN, SiO, or SiON is to be deposited by CVD, silane gas containing hydrogen ($SiH_4$) is normally used as the material gas. Accordingly, hydrogen atoms are contained in the insulating film. Therefore, the hydrogen atoms are diffused from the interface of the insulating film into the oxide semiconductor film due to irradiation with ultraviolet rays. The diffused hydrogen atoms act as donors, and electron carriers are generated. The resistance of the oxide semiconductor film is thereby reduced. Accordingly, the step for reducing the resistance of the first transparent electrode 5 by irradiation with ultraviolet rays or the like is preferably performed after deposition of the second insulating film 6. Also, it is assumed that the first insulating film 3 and the second insulating film 6 are preferably deposited by CVD using $SiH_4$ gas.

(Effects)

According to the liquid crystal display device 91 of the present preferred embodiment, a large storage capacitance may be secured by providing the first transparent electrode 5 to the TFT substrate 71. Specifically, the storage capacitance per substrate area may be increased because two storage capacitances, namely, a first storage capacitance formed by the first transparent electrode 5 and the second transparent electrode 9 across the second insulating film 6, and a second storage capacitance formed by the second transparent electrode 9 and the third transparent electrode 11 across the third insulating film 10, are formed. Particularly, because the pair of structural electrodes of the first storage capacitance are both flat electrodes, a large electrode area may be secure. Also, because the first transparent electrode 5 is transparent, a high aperture ratio may be secured. Furthermore, the first transparent electrode 5 is, like the element layer 4, directly disposed on the first insulating film 3, and has the same composition as the composition of the element layer 4. Accordingly, each of the deposition step and the patterning step may be performed simultaneously for the first transparent electrode 5 and the element layer 4. That is, it is not necessary to perform deposition and patterning only to form the first transparent electrode 5. Accordingly, an increase in the manufacturing cost due to providing the first transparent electrode 5 may be suppressed. Consequently, a large storage capacitance and a high aperture ratio may be secured while suppressing an increase in the manufacturing cost.

The channel region 46 is made of an oxide semiconductor with possibly higher mobility than a silicon semiconductor. This allows the channel region 46 to be further miniaturized. Accordingly, the aperture ratio of the TFT substrate 71 may be further increased.

The second insulating film 6 is provided between the first transparent electrode 5 and the second transparent electrode 9, as a dielectric layer for forming a storage capacitance by the two electrodes. The second insulating film 6 includes a part that covers the channel region 46 of the element layer 4. Therefore, the second insulating film 6 also functions as a channel protection film (an etch stopper layer) for protecting the channel region 46, which is made of an oxide semiconductor which is easily damaged in the etching step. The channel region 46 may thereby be protected without increasing the number of masks or the number of manufacturing steps. Accordingly, the manufacturing cost may be further suppressed.

The second insulating film 6 as a dielectric layer for forming a storage capacitance by the first transparent electrode 5 and the second transparent electrode 9 is thinner than the first insulating film 3 as a gate insulating film. Accordingly, the thickness of the gate insulating film may be sufficiently secured while increasing the storage capacitance by reducing the thickness of the second insulating film 6. Because the gate insulating film has a sufficient thickness, the withstanding voltage of the TFT may be more reliably secured. Accordingly, the yield of the liquid crystal display devices 91 may be increased. For example, typically, at the time of operation of the liquid crystal display device 91, voltage of several tens of volts is applied between the gate electrode 2 and the drain electrode 8. Accordingly, normally, to secure a sufficient margin for dielectric strength, the film thickness of the first insulating film 3 functioning as a gate insulating film has to be at least 300 nm to 400 nm. On the other hand, with the second transparent electrode 9 as a pixel electrode, voltage that is applied is low being about several volts or lower, and high dielectric strength is not required. Accordingly, the second insulating film 6 does not have to be made thick.

The resistance of the first transparent electrode 5 is lower than the resistance of the channel region 46 of the element layer 4. Therefore, the resistance component of the storage capacitance formed by the first transparent electrode 5 may be reduced.

The electron carrier concentration of the first transparent electrode 5 is higher than the electron carrier concentration of the channel region 46 of the element layer 4. Accordingly, the resistance of the first transparent electrode 5 may be reduced than the resistance of the channel region 46 in spite of the composition of the first transparent electrode 5 being the same as the composition of the element layer 4.

According to the manufacturing method of the liquid crystal display device 91 of the present preferred embodiment, because the first transparent electrode 5 is provided, a high storage capacitance may be secured. Also, because the first transparent electrode 5 is transparent, a high aperture ratio may be secured. Furthermore, the first transparent electrode 5 is formed together with the element layer 4 from the transparent oxide layer 40 (FIG. 6) which is deposited in advance. That is, deposition and patterning do not have to be performed just for forming the first transparent electrode 5. Accordingly, an increase in the manufacturing cost due to providing the first transparent electrode 5 may be suppressed. Consequently, a large storage capacitance and a high aperture ratio may be secured while suppressing an increase in the manufacturing cost.

In patterning the transparent oxide layer 40, the second resist pattern 41 (FIG. 6) having patterns corresponding to the element layer 4 and the first transparent electrode 5 is used as a mask layer. Accordingly, it is not necessary to form two mask layers corresponding, respectively, to the element layer 4 and the first transparent electrode 5. Consequently, an increase in the manufacturing cost may be further suppressed.

The resistance of the first transparent electrode 5 is reduced by irradiation of the energy rays 44 (FIG. 9). Accordingly, the resistance of the first transparent electrode 5 may be easily reduced.

The channel region 46 of the element layer 4 is shielded from the energy rays 44 (FIG. 9) by the gate electrode 2. Therefore, it is not necessary to provide a special structure for shielding the channel region 46 from the energy rays 44. Accordingly, an increase in the manufacturing cost may be further suppressed.

A non-insulating member (a conductive member) forming an electrical path is preferably not disposed between the first transparent electrode 5 and the first transparent substrate 1. This prevents the energy rays from being greatly attenuated or the conductive member from being deteriorated at the time of irradiation of the energy rays 44 (FIG. 9) via the first transparent substrate 1.

Second Preferred Embodiment (Structure)

Figure 16:
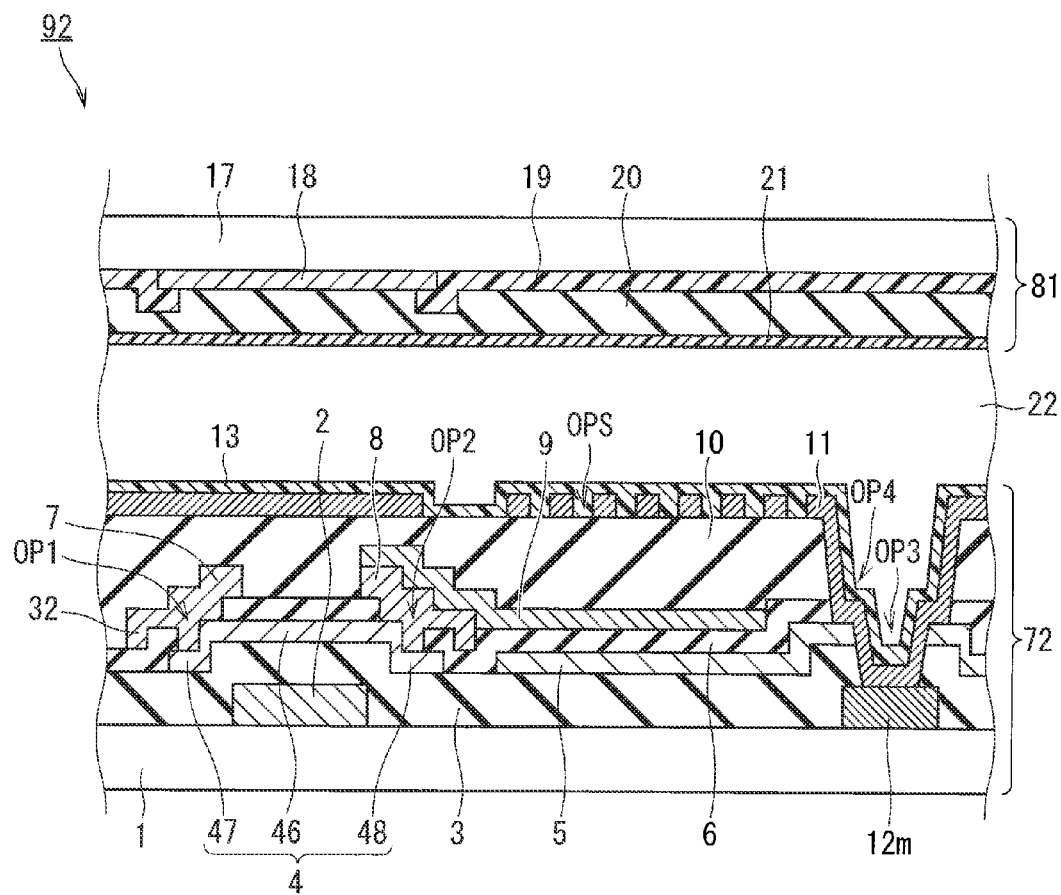
FIG. 16 is a partial cross-sectional view schematically showing a structure of a liquid crystal display device according to a second preferred embodiment of the present invention in a range corresponding to one pixel region, along line XVI-XVI (FIG. 17)
Figure 17:
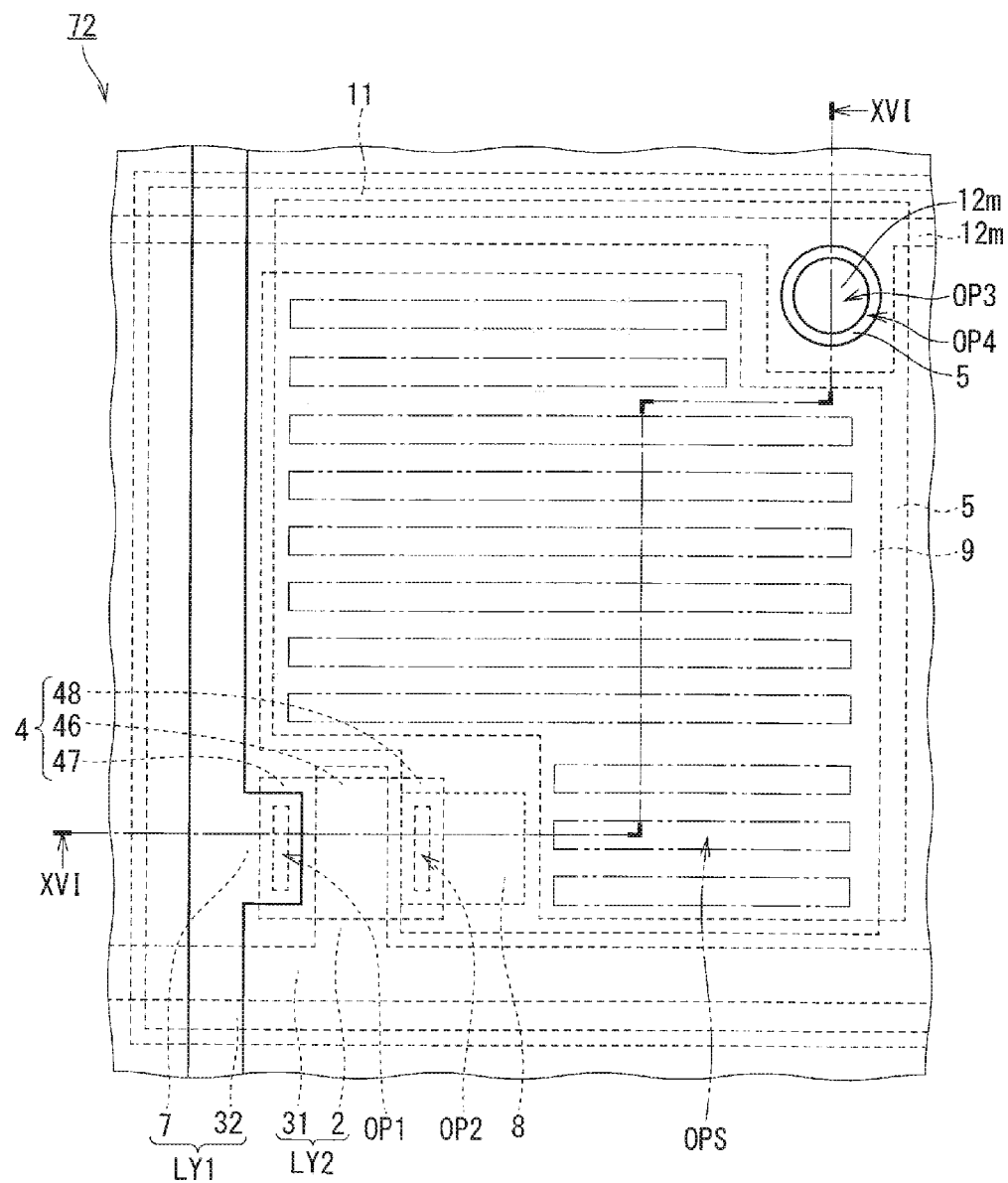
FIG. 17 is a partial plan view schematically showing a structure of a TFT substrate of the liquid crystal display device according to the second preferred embodiment of the present invention in a range corresponding to one pixel region.

FIG. 16 is a partial cross-sectional view schematically showing a structure of a liquid crystal display device 92 of the present preferred embodiment in a range corresponding to one pixel region, along line XVI-XVI (FIG. 17). FIG. 17 is a partial plan view schematically showing a structure of a TFT substrate 72 (an array substrate) of the liquid crystal display device 92 in a range corresponding to one pixel region. Additionally, in FIG. 17, for the sake of visibility, a first alignment film 13 (FIG. 16) and a third insulating film 10 are not shown, and also, only slit-shaped opening portions OPS are shown by two-dot chain lines for a third transparent electrode 11 (FIG. 16).

The liquid crystal display device 92 includes a TFT substrate 72 instead of the TFT substrate (FIG. 1) of the liquid crystal display device 91. The main difference between the TFT substrate 72 and the TFT substrate 71 is that the TFT substrate 72 is provided with a common electrode wiring layer 12m instead of the common electrode wiring layer 12. The common electrode wiring layer 12m is disposed on a first transparent substrate 1. In other words, the common electrode wiring layer 12m is formed on the same layer as a second conductive layer LY2 (FIG. 17). Accordingly, a structure different from the first preferred embodiment is provided so as to electrically connect the common electrode wiring layer 12m to a first transparent electrode 5 and the third transparent electrode 11.

The common electrode wiring layer 12m includes, on a surface of the first transparent substrate 1 facing a liquid crystal layer 22, a part that extends in parallel with a scanning wiring layer 31 (the part extending in the lateral direction in FIG. 17). A laminate (FIG. 16) of a first insulating film 3 and the first transparent electrode 5 includes a third opening portion OP3 above the common electrode wiring layer 12m, and the common electrode wiring layer 12m is thereby partially exposed. Moreover, a laminate of a second insulating film 6 and the third insulating film 10 includes, above the third opening portion OP3, a fourth opening portion OP4 larger than the third opening portion OP3, and the common electrode wiring layer 12m and the first transparent electrode 5 are thereby exposed to the surface. The third transparent electrode 11 covers the third opening portion OP3 and the fourth opening portion OP4. Therefore, the first transparent electrode 5, the third transparent electrode 11, and the common electrode wiring layer 12m are electrically connected to one another.

Additionally, structures other than those described above are approximately the same as the structures in the first preferred embodiment described above, and the same or corresponding elements are denoted by the same reference numeral, and redundant description is omitted.

(Manufacturing Method)

Next, a manufacturing method of the TFT substrate 72 of the liquid crystal display device 92 will be described below.

Figure 18:
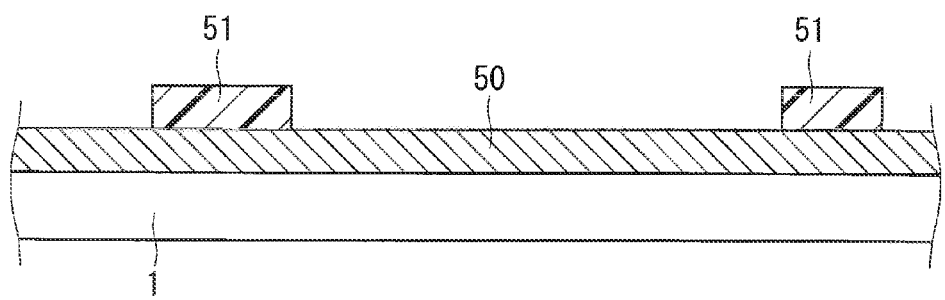
FIG. 18 is a partial cross-sectional view schematically showing a first step of a manufacturing method of the liquid crystal display device according to the second preferred embodiment of the present invention in a view corresponding to FIG. 16.

Referring to FIG. 18, a metal layer 50 is formed on an entire surface of the first transparent substrate 1. For example, as the metal layer 50, an Al film of a thickness of 300 nm is deposited by sputtering. Next, a photosensitive resin film (not shown) is applied on the metal layer 50 by spin coating. Then, the photosensitive resin film is patterned by using a first photo mask, and a first resist pattern 51 is thereby formed. Moreover, an unnecessary portion, of the metal layer 50, exposed from the first resist pattern 51 is removed by wet etching. Then, the first resist pattern 51 is peeled off.

Figure 19:
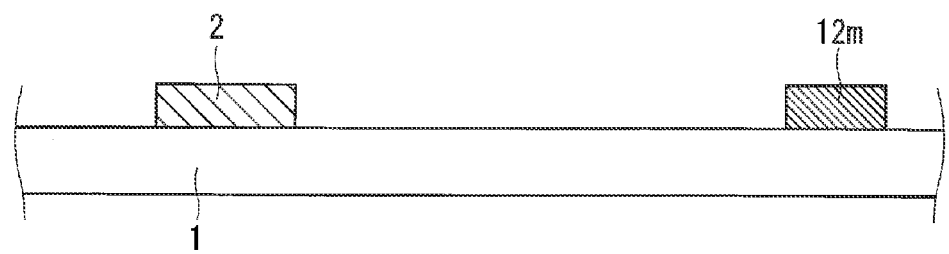
FIG. 19 is a partial cross-sectional view schematically showing a second step of the manufacturing method of the liquid crystal display device according to the second preferred embodiment of the present invention in the view corresponding to FIG. 16.

Referring to FIG. 19, the second conductive layer LY2 (FIG. 17) including the gate electrode 2, and the common electrode wiring layer 12m are collectively formed by the etching.

Figure 20:
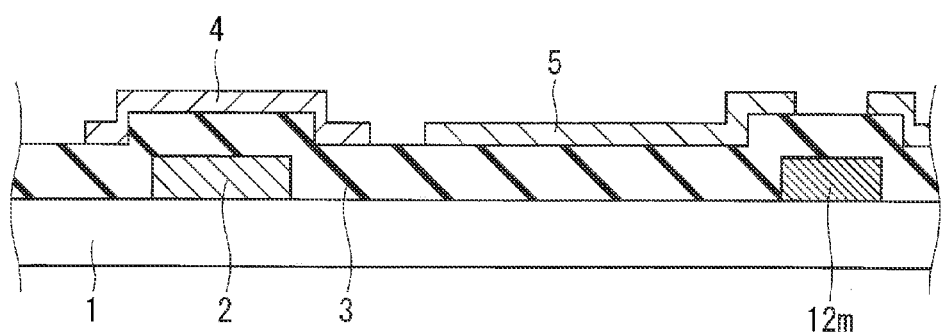
FIG. 20 is a partial cross-sectional view schematically showing a third step of the manufacturing method of the liquid crystal display device according to the second preferred embodiment of the present invention in the view corresponding to FIG. 16.

Referring to FIG. 20, the first insulating film 3, an element layer 4, and the first transparent electrode 5 are formed by approximately the same method as in FIGS. 5 to 7 (the first preferred embodiment). In the present preferred embodiment, the first insulating film 3 covers the common electrode wiring layer 12m. Also, an opening to be a part of the third opening portion OP3 (FIG. 16) is formed to the first transparent electrode 5. This opening partially exposes the first insulating film 3.

Figure 21:
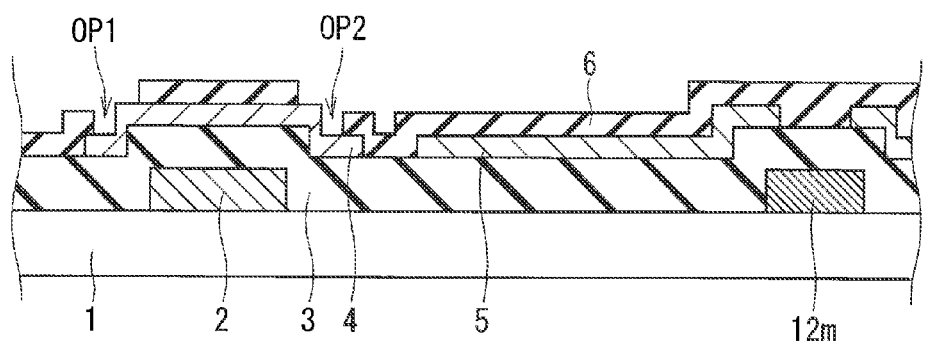
FIG. 21 is a partial cross-sectional view schematically showing a fourth step of the manufacturing method of the liquid crystal display device according to the second preferred embodiment of the present invention in the view corresponding to FIG. 16.
Figure 22:
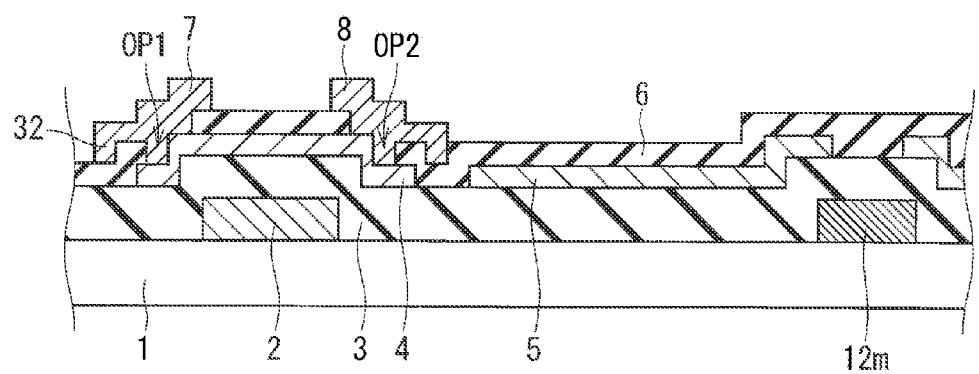
FIG. 22 is a partial cross-sectional view schematically showing a fifth step of the manufacturing method of the liquid crystal display device according to the second preferred embodiment of the present invention in the view corresponding to FIG. 16.
Figure 23:
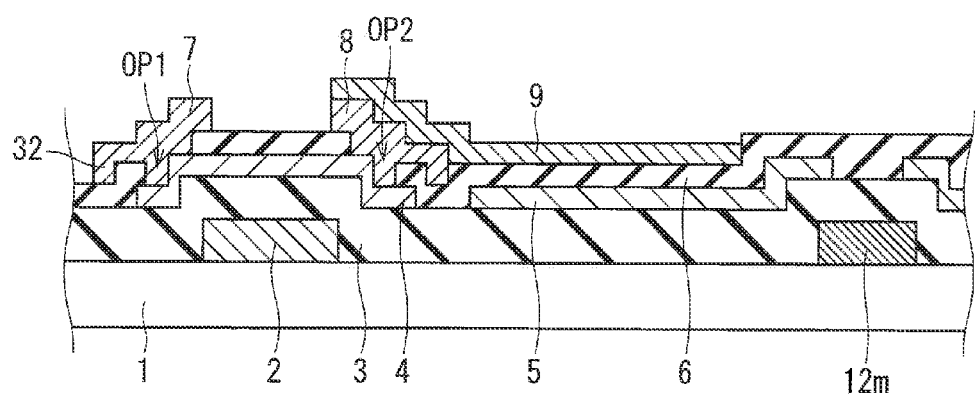
FIG. 23 is a partial cross-sectional view schematically showing a sixth step of the manufacturing method of the liquid crystal display device according to the second preferred embodiment of the present invention in the view corresponding to FIG. 16.

Referring to FIG. 21, the second insulating film 6 is formed, and irradiation with energy rays is performed by the same method as in FIGS. 8 to 10 (the first preferred embodiment). Referring to FIGS. 22 and 23, a signal wiring layer 32 and a source electrode 7, which are integrated with each other, a drain electrode 8, and a second transparent electrode 9 are formed in the same manner as in FIGS. 11 and 12 (the first preferred embodiment).

Figure 24:
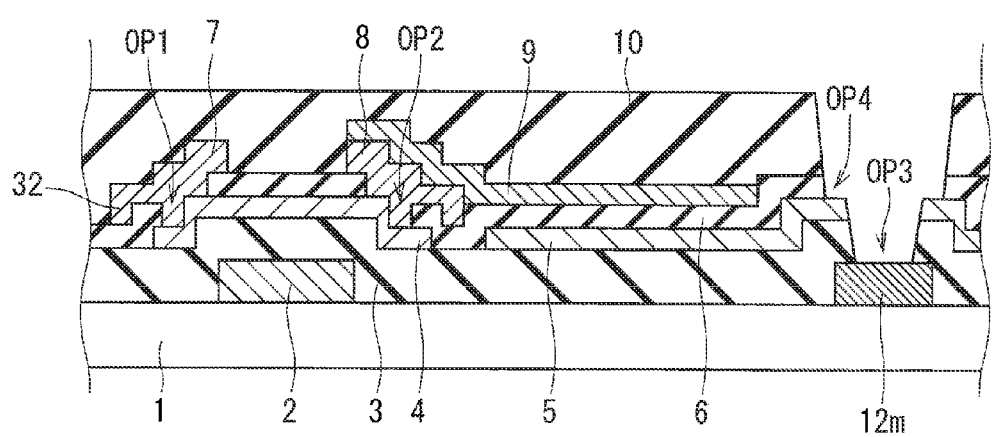
FIG. 24 is a partial cross-sectional view schematically showing a seventh step of the manufacturing method of the liquid crystal display device according to the second preferred embodiment of the present invention in the view corresponding to FIG. 16.

Referring to FIG. 24, the third insulating film 10 is formed in the same manner as in FIG. 13 (the first preferred embodiment). Also, in the present preferred embodiment, the fourth opening portion OP4 is formed to the third insulating film 10 and the second insulating film 6. Then, the second insulating film 6 which filled the opening of the first transparent electrode 5 is removed, and an opening is formed to the first insulating film 3 to thereby form the third opening portion OP3. The fourth opening portion OP4 and the third opening portion OP3 may be formed by wet etching. Specifically, as an etching solution for etching the third insulating film 10 and the second insulating film 6, an etching solution with a high etching selectivity to the first transparent electrode 5 is used. This allows the third insulating film 10, the second insulating film 6, and the first insulating film 3 to be removed while keeping the pattern of the first transparent electrode 5. An opening portion exposing both the common electrode wiring layer 12m and the first transparent electrode 5 to the surface may be formed by this etching.

Figure 25:
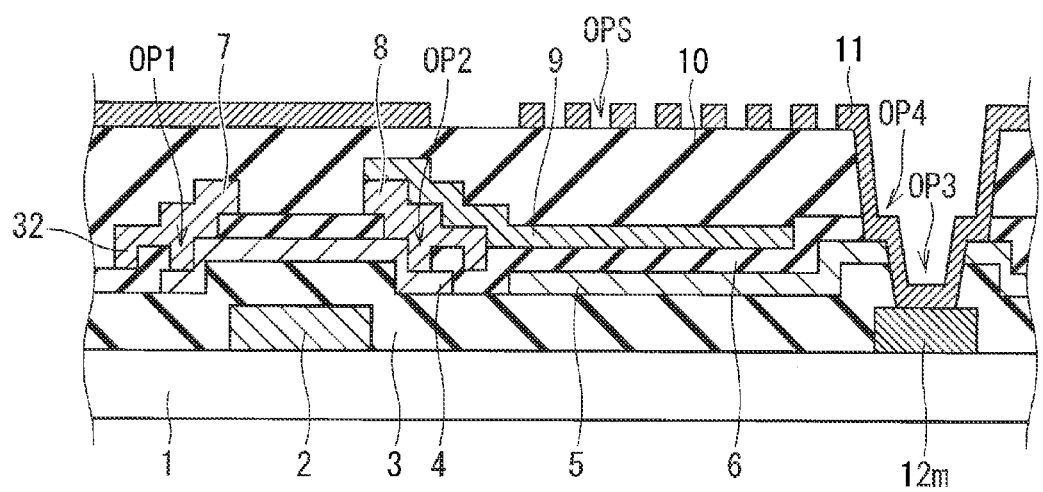
FIG. 25 is a partial cross-sectional view schematically showing an eighth step of the manufacturing method of the liquid crystal display device according to the second preferred embodiment of the present invention in the view corresponding to FIG. 16.

Referring to FIG. 25, the third transparent electrode 11 is formed in the same manner as in FIG. 15 (the first preferred embodiment). In the present preferred embodiment, the third transparent electrode 11 covers the third opening portion OP3 and the fourth opening portion OP4.

Subsequent steps for obtaining the TFT substrate 72, and for obtaining the liquid crystal display device 92 using the same are the same as in the first preferred embodiment, and redundant description is omitted.

(Effects)

Also with the present preferred embodiment, approximately the same effects as those of the first preferred embodiment may be achieved. Moreover, according to the present preferred embodiment, as shown in FIGS. 18 and 19, the second conductive layer LY2 (FIG. 17) including the gate electrode 2, and the common electrode wiring layer 12m may be formed at the same time. Accordingly, the number of steps and the number of masks may be reduced. This allows the manufacturing cost to be further reduced.

Third Preferred Embodiment (Structure)

In the first and the second preferred embodiments, the liquid crystal display devices 91 and 92 of the FFS method have been described. That is, liquid crystal display devices of a lateral electric field method have been described. In the present preferred embodiment, a liquid crystal display device of a longitudinal electric field method will be described.

Figure 26:
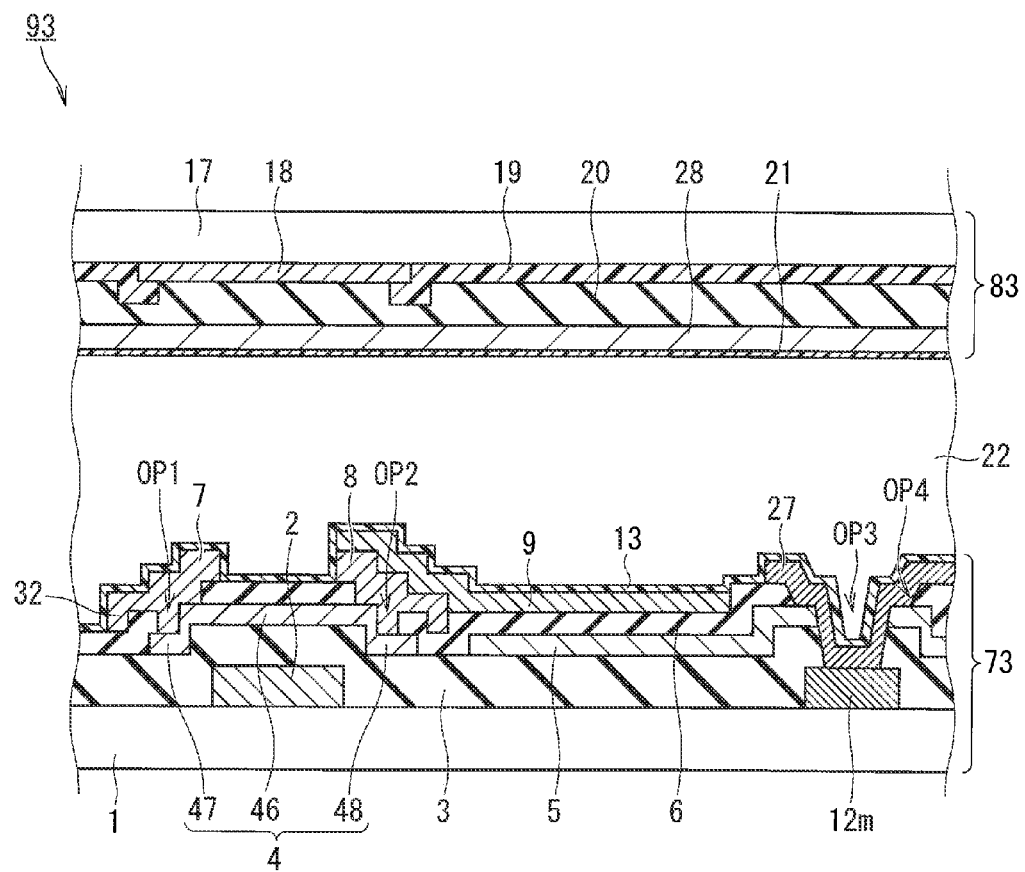
FIG. 26 is a partial cross-sectional view schematically showing a structure of a liquid crystal display device according to a third preferred embodiment of the present invention in a range corresponding to one pixel region, along line XXVI-XXVI (FIG. 27)
Figure 27:
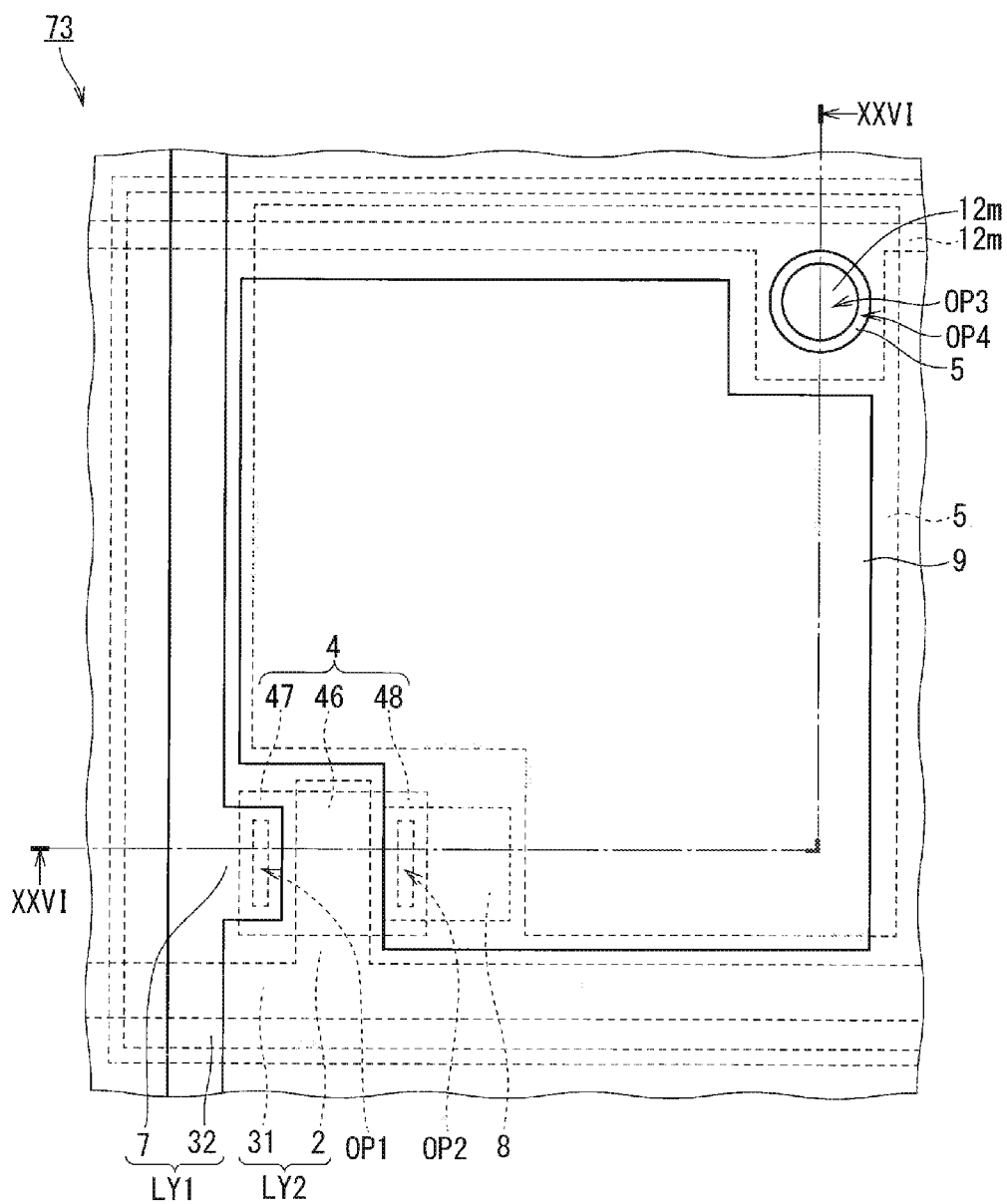
FIG. 27 is a partial plan view schematically showing a structure of a TFT substrate of the liquid crystal display device according to the third preferred embodiment of the present invention in a range corresponding to one pixel region.

FIG. 26 is a partial cross-sectional view schematically showing a structure of a liquid crystal display device 93 of the present preferred embodiment in a range corresponding to one pixel region, along line XXVI-XXVI (FIG. 27). FIG. 27 is a partial plan view schematically showing a structure of a TFT substrate 73 of the liquid crystal display device 93 in a range corresponding to one pixel region. Additionally, in FIG. 27, a first alignment film 13 (FIG. 26) is not shown for the sake of visibility. The liquid crystal display device 93 includes a TFT substrate 73 (an array substrate), a liquid crystal layer 22, and a CF substrate 83 (a counter substrate).

Unlike in the second preferred embodiment, the TFT substrate 73 does not include the third insulating film 10 (FIG. 16), and a fourth opening portion OP4 is formed to a second insulating film 6. Also, instead of the third transparent electrode 11 (FIG. 16), the TFT substrate 73 includes a third transparent electrode 27. Like the third transparent electrode 11, the third transparent electrode 27 covers a third opening portion OP3 and the fourth opening portion OP4 so as to electrically connect a first transparent electrode 5 and a common electrode wiring layer 12*m*. The third transparent electrode 27 is formed on the same layer as a second transparent electrode 9, which functions as a pixel electrode. The second transparent electrode 9 and the third transparent electrode 27 are electrically separated from each other by a patterning.

The CF substrate 83 includes a counter electrode 28, which is a transparent electrode, in addition to the structure of the CF substrate 81 (FIG. 16). According to this structure, an electric field having a component that is perpendicular to the surface of the TFT substrate 73 may be generated, between the counter electrode 28 of the CF substrate 83 and the second transparent electrode 9 of the TFT substrate 73, to drive the liquid crystal layer 22.

Additionally, structures other than those described above are approximately the same as the structures in the second preferred embodiment described above, and the same or corresponding elements are denoted by the same reference numeral, and redundant description is omitted.

(Manufacturing Method)

Next, a manufacturing method of the TFT substrate 73 of the liquid crystal display device 93 will be described below. Incidentally, the same steps as in the second preferred embodiment are performed up to FIG. 20.

Figure 28:
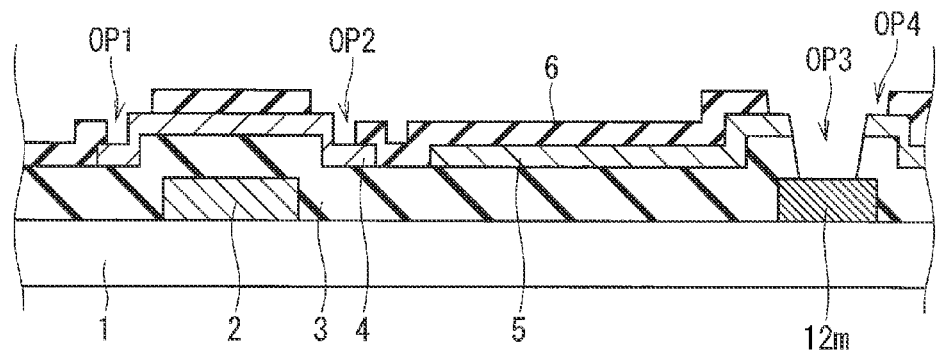
FIG. 28 is a partial cross-sectional view schematically showing a fourth step of a manufacturing method of the liquid crystal display device according to the third preferred embodiment of the present invention in a view corresponding to FIG. 26.
Figure 29:
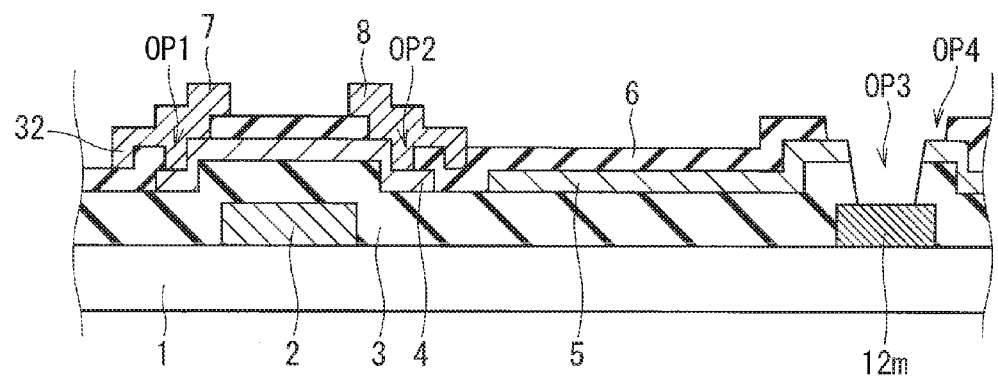
FIG. 29 is a partial cross-sectional view schematically showing a fifth step of the manufacturing method of the liquid crystal display device according to the third preferred embodiment of the present invention in the view corresponding to FIG. 26.

Referring to FIG. 28, after the second insulating film 6 is deposited, the fourth opening portion OP4 and the third opening portion OP3 are formed by the same method as in the second preferred embodiment, without forming the third insulating film 10 (FIG. 24: second preferred embodiment). Referring to FIG. 29, a source electrode 7 and a drain electrode 8 are formed in the same manner as in the second preferred embodiment.

Figure 30:
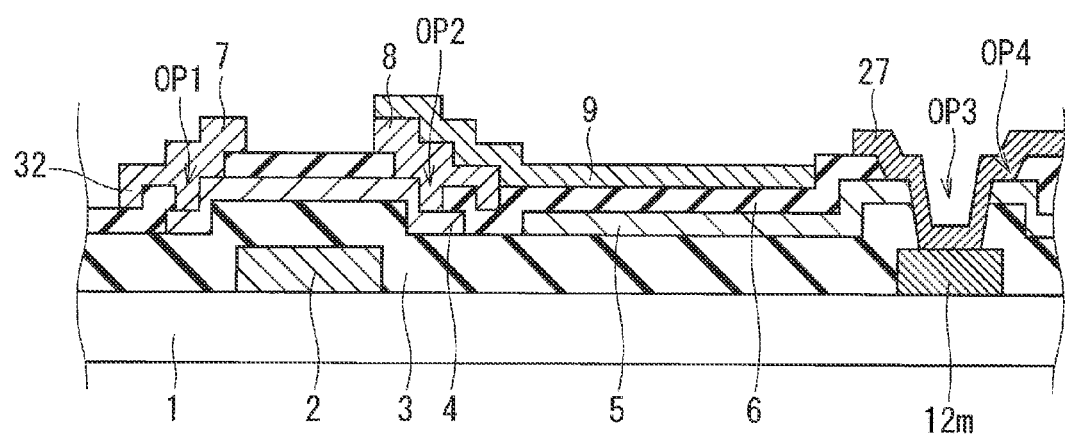
FIG. 30 is a partial cross-sectional view schematically showing a sixth step of the manufacturing method of the liquid crystal display device according to the third preferred embodiment of the present invention in the view corresponding to FIG. 26.

Referring to FIG. 30, a second transparent oxide film is deposited as in the first and the second preferred embodiments. By patterning the second transparent oxide film, a pattern including a region from a transparent display region excluding the fourth opening portion OP4 to above the drain electrode 8, and a region formed to cover the fourth opening portion OP4 is formed at one time. The former corresponds to the second transparent electrode 9, and the latter to the third transparent electrode 27. The second transparent electrode 9 and the third transparent electrode 27 are physically separated from each other by this patterning.

A subsequent step for obtaining the TFT substrate 73 is the same as in the second preferred embodiment, and redundant description is omitted. The liquid crystal display device 93 is obtained by attaching the CF substrate 83 to the TFT substrate 73, and by providing the liquid crystal layer 22.

(Effects)

According to the liquid crystal display device 93 of the present preferred embodiment, a storage capacitance may be secured by providing the first transparent electrode 5 to the TFT substrate 73. Specifically, a storage capacitance is formed by the first transparent electrode 5 and the second transparent electrode 9 across the second insulating film 6. Moreover, approximately the same effects as those of the second preferred embodiment may be obtained.

Additionally, the preferred embodiments may be freely combined or modifications or omissions may be made in each preferred embodiment as appropriate within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A liquid crystal display device comprising:
   a gate electrode;
   a first insulating film that includes a part that covers said gate electrode;
   an element layer that is directly disposed on said first insulating film, that includes a channel region that faces said gate electrode across said first insulating film, and that is made of a transparent oxide;
   a first transparent electrode that is directly disposed on said first insulating film while being separated from said element layer, and that has a same metal composition as a metal composition of said element layer; and
   a second transparent electrode that forms a storage capacitance with said first transparent electrode by facing said first transparent electrode while being electrically insulated from said first transparent electrode.

2. The liquid crystal display device according to claim 1, wherein said element layer includes a first end portion and a second end portion that are separated from each other by said channel region, and
   wherein said liquid crystal display device further comprises a second insulating film including a part that covers said channel region of said element layer and a part that separates said first transparent electrode and said second transparent electrode, said second insulating film being provided with a first opening portion that exposes said first end portion and a second opening portion that exposes said second end portion.

3. The liquid crystal display device according to claim 2, wherein said second insulating film is thinner than said first insulating film.

4. The liquid crystal display device according to claim 1, wherein a resistance of said first transparent electrode is lower than a resistance of said channel region of said element layer.

5. The liquid crystal display device according to claim 1, wherein an electron carrier concentration of said first transparent electrode is higher than an electron carrier concentration of said channel region of said element layer.

6. A liquid crystal display device comprising:
   a gate electrode;
   a first insulating film that includes a part that covers said gate electrode;
   an element layer that is disposed on said first insulating film, that includes a channel region that faces said gate electrode across said first insulating film, and that is made of a transparent oxide;
   a first transparent electrode that is disposed on said first insulating film and in a same layer with said element layer while being separated from said element layer, and that has a same metal composition as a metal composition of said element layer; and
   a second transparent electrode that forms a storage capacitance with said first transparent electrode by facing said first transparent electrode while being electrically insulated from said first transparent electrode.

7. A manufacturing method of a liquid crystal display device, comprising the steps of:
   forming a gate electrode to each of a plurality of pixels;
   forming a first insulating film that includes a part that covers said gate electrode;
   depositing a transparent oxide layer on said first insulating film;
   forming, from said transparent oxide layer, an element layer that includes a channel region that faces said gate electrode across said first insulating film, and a first transparent electrode that is separated from said element layer; and forming a second transparent electrode that forms a storage capacitance with said first transparent electrode by facing said first transparent electrode while being electrically insulated from said first transparent electrode;

wherein forming said element layer and said first transparent electrode includes reducing a resistance of said first transparent electrode by irradiating said first transparent electrode with energy rays.

8. The manufacturing method of the liquid crystal display device according to claim 7, wherein forming said element layer and said first transparent electrode includes forming, on said transparent oxide layer, a mask layer with patterns corresponding to said element layer and said first transparent electrode, and patterning said transparent oxide layer by using said mask layer.

9. The manufacturing method of the liquid crystal display device according to claim 7, wherein, in reducing a resistance of said first transparent electrode, said channel region of said element layer is shielded from said energy rays by said gate electrode.

* * * * *